United States Patent
Smalley et al.

(10) Patent No.: US 10,808,173 B2
(45) Date of Patent: Oct. 20, 2020

(54) LUMINESCENT HYPERBOLIC METASURFACES

(71) Applicant: The Regents of the University of California, Oakland, CA (US)

(72) Inventors: Joseph Smalley, La Jolla, CA (US); Yeshaiahu Fainman, San Diego, CA (US); Felipe Vallini, San Diego, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 325 days.

(21) Appl. No.: 15/707,965

(22) Filed: Sep. 18, 2017

(65) Prior Publication Data

US 2019/0031955 A1    Jan. 31, 2019

Related U.S. Application Data

(60) Provisional application No. 62/395,869, filed on Sep. 16, 2016.

(51) Int. Cl.
   *C09K 11/74*     (2006.01)
   *G02B 5/18*      (2006.01)
   (Continued)

(52) U.S. Cl.
   CPC .......... *C09K 11/7492* (2013.01); *C09K 11/02* (2013.01); *C30B 23/025* (2013.01);
   (Continued)

(58) Field of Classification Search
   CPC ...... C09K 11/7492; C09K 11/02; G02B 5/18; G02B 5/1814; G02B 5/1861; G02B 27/0037; G02B 27/4211; G02B 5/1809; G02B 5/1852; G02B 5/1847; G02B 27/0172; G02B 27/0944; G02B 27/4272; G02B 27/4277; G02B 5/1857; G02B 5/1895; G02B 1/04; G02B 27/0081; G02B 5/1842; G02B 5/1871; G02B 5/1876;
   (Continued)

(56) References Cited

U.S. PATENT DOCUMENTS

| 10,128,387 B1* | 11/2018 | Liu | ..................... H01S 5/4025 |
| 2009/0315020 A1* | 12/2009 | Sandhu | ................. B82Y 10/00 257/30 |

OTHER PUBLICATIONS

Smalley et al., "Luminescent Hyperbolic Metasurfaces", Nature Communications 8, Article No. 13793, 2017.
(Continued)

*Primary Examiner* — Collin X Beatty
*Assistant Examiner* — Grant A Gagnon
(74) *Attorney, Agent, or Firm* — Perkins Coie LLP

(57) ABSTRACT

Techniques, systems, and devices are disclosed for implementing light-emitting hyperbolic metasurfaces. In one exemplary aspect, a light-emitting device includes a surface; a plurality of quantum heterostructures positioned on the surface, each of the plurality of quantum heterostructures including multiple quantum wells distributed along an axis perpendicular to the surface and separated by multiple quantum barriers, wherein each two adjacent quantum heterostructures of the plurality quantum heterostructures form a gap; and a monocrystalline material at least partially filling gaps between the plurality quantum heterostructures.

26 Claims, 20 Drawing Sheets

(51) Int. Cl.
| | |
|---|---|
| *C09K 11/02* | (2006.01) |
| *C30B 23/04* | (2006.01) |
| *C30B 29/02* | (2006.01) |
| *C30B 23/02* | (2006.01) |
| *G02B 1/00* | (2006.01) |
| *B82Y 40/00* | (2011.01) |
| *B82Y 20/00* | (2011.01) |

(52) U.S. Cl.
CPC .............. *C30B 23/04* (2013.01); *C30B 29/02* (2013.01); *G02B 1/002* (2013.01); *G02B 5/18* (2013.01); *B82Y 20/00* (2013.01); *B82Y 40/00* (2013.01); *G02B 5/1809* (2013.01); *G02B 2207/113* (2013.01)

(58) Field of Classification Search
CPC .................. G02B 13/18; G02B 17/004; G02B 2027/0174; G02B 27/42; G02B 27/425; G02B 5/1866; G02B 5/223; G02B 6/00; G02B 17/023; G02B 1/14; G02B 2027/0112; G02B 2027/0116; G02B 21/361; G02B 26/001; G02B 26/0808; G02B 27/0101; G02B 27/1086; G02B 27/1093; G02B 27/2214; G02B 27/283; G02B 27/4216; G02B 27/4233; G02B 27/4266; G02B 5/04; G02B 5/1838; G02B 5/203; G02B 6/0016; G02B 6/0035; G02B 6/0058; G02B 6/2931; G02B 7/00; G02B 13/004; G02B 13/02; G02B 13/04; G02B 17/002; G02B 17/02; G02B 17/084; G02B 17/086; G02B 17/0896; G02B 19/0014; G02B 19/0028; G02B 19/0052; G02B 19/0061; G02B 1/005; G02B 1/041; G02B 1/115; G02B 2005/1804; G02B 2006/12107; G02B 2006/12169; G02B 2027/011; G02B 2027/0118; G02B 2027/0123; G02B 2027/0125; G02B 2027/0134; G02B 2027/0178; G02B 21/0044; G02B 21/0056; G02B 21/02; G02B 21/06; G02B 21/086; G02B 21/18; G02B 21/244; G02B 21/367; G02B 2207/107; G02B 23/14; G02B 26/005; G02B 26/007; G02B 26/123; G02B 26/125; G02B 27/0018; G02B 27/0025; G02B 27/0087; G02B 27/0103; G02B 27/0905; G02B 27/0955; G02B 27/1006; G02B 27/1073; G02B 27/285; G02B 27/30; G02B 27/34; G02B 27/4205; G02B 27/4227; G02B 27/4244; G02B 27/4288; G02B 27/4294; G02B 27/44; G02B 27/46; G02B 27/48; G02B 3/0006; G02B 3/0075; G02B 3/08; G02B 5/00; G02B 5/008; G02B 5/0242; G02B 5/0278; G02B 5/0808; G02B 5/0891; G02B 5/10; G02B 5/1833; G02B 5/32; G02B 6/0011; G02B 6/0018; G02B 6/0026; G02B 6/0028; G02B 6/0036; G02B 6/0038; G02B 6/12002; G02B 6/12007; G02B 6/124; G02B 6/2773; G02B 6/29308; G02B 6/29328; G02B 6/351; G02B 6/3534; G02B 6/3556; G02B 6/356; G02B 6/3592; G02B 6/4218; G02B 6/4271; G02B 6/4285; G02B 6/4296; G02B 7/021; G02B 9/34; G03B 35/00; G03B 21/2033; G03B 21/208; G03B 2215/0589; B82Y 10/00
USPC ......................................................... 359/566
See application file for complete search history.

(56) References Cited

OTHER PUBLICATIONS

Smalley et al., "Light-Emitting Hyperbolic Metasurfaces at Telecom Frequencies", Advanced Photonics 2016 (IPR, NOMA, Sensors, Networtks, SPPCom, SOF), Optical Society of America, 2016, paper NoM3C.3.

Smalley et al., "Modal Amplification in Active Waveguides with Hyperbolic Dispersion at Telecommunication Frequencies", Optics Express, vol. 22, No. 17, 2014.

* cited by examiner

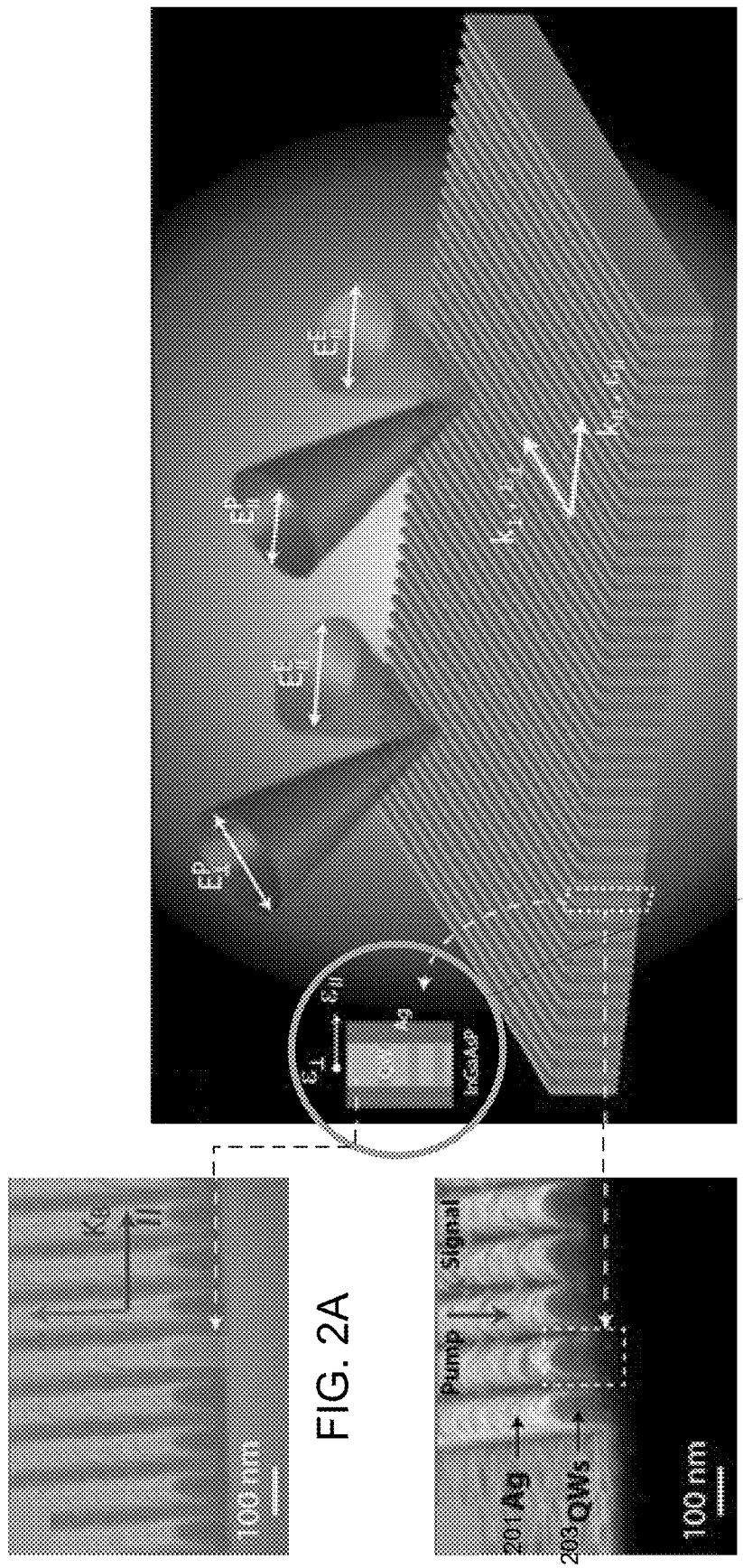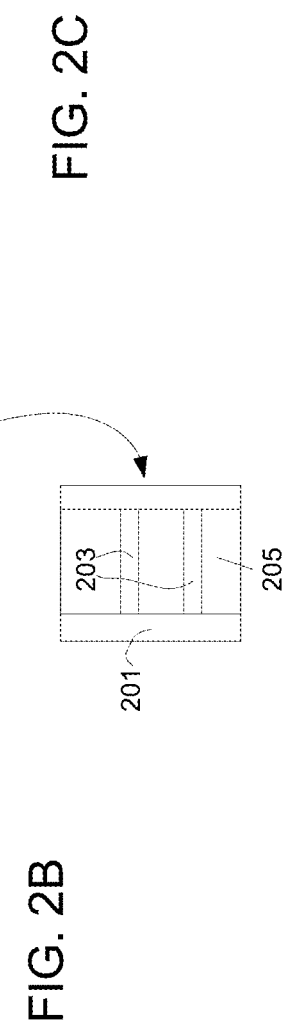
FIG. 2A
FIG. 2B
FIG. 2C

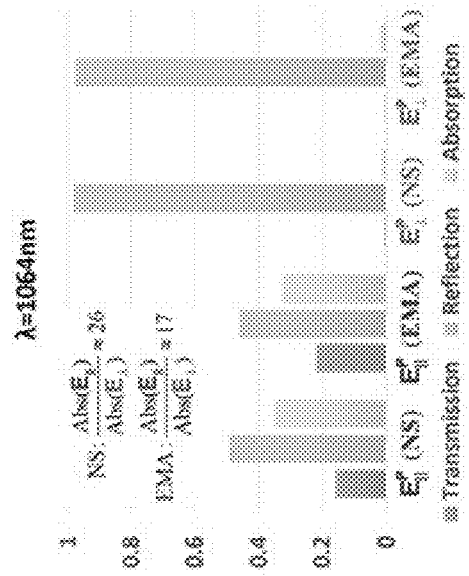
FIG. 10B
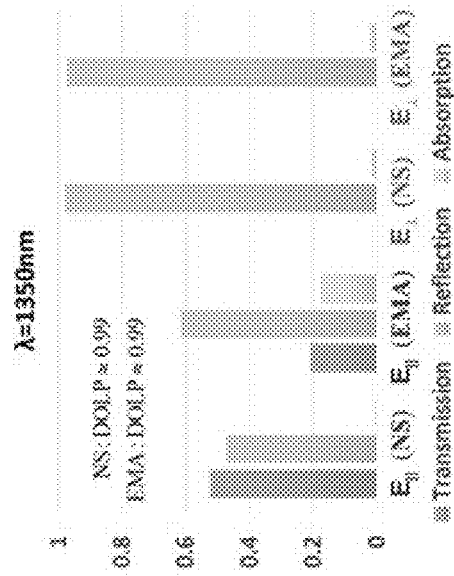
FIG. 10D
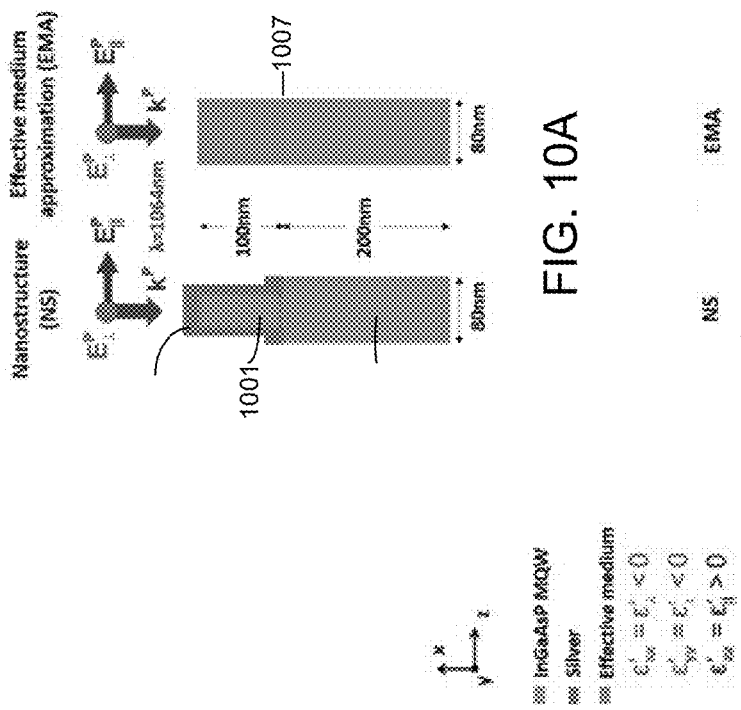
FIG. 10A
FIG. 10C

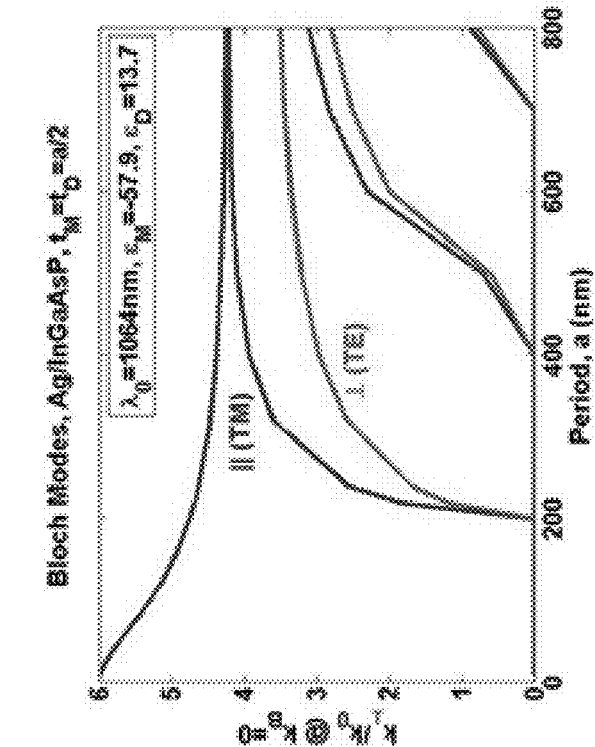
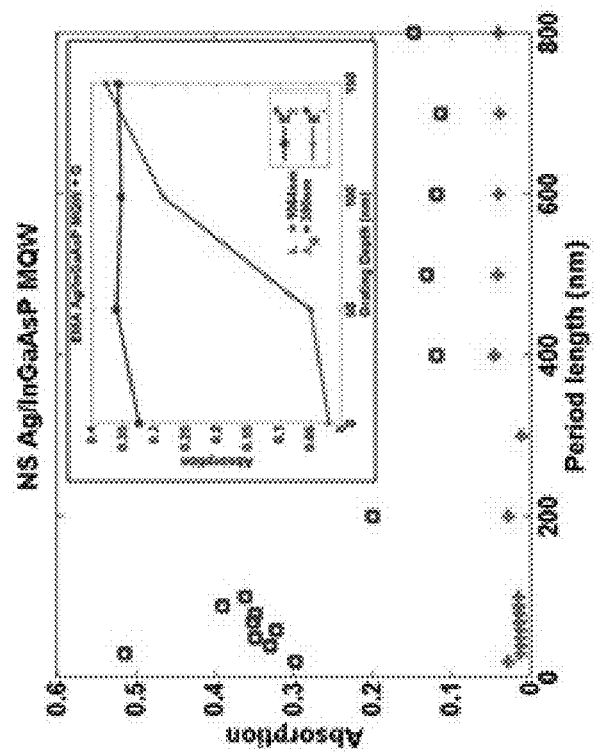
FIG. 11B
FIG. 11A

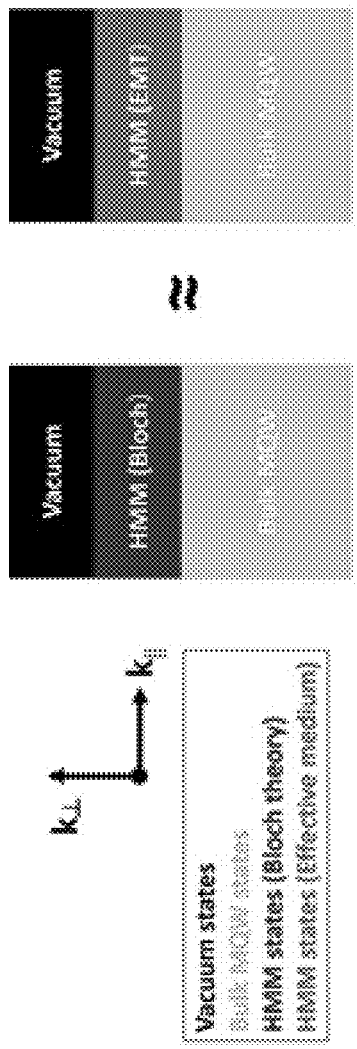
FIG. 13A
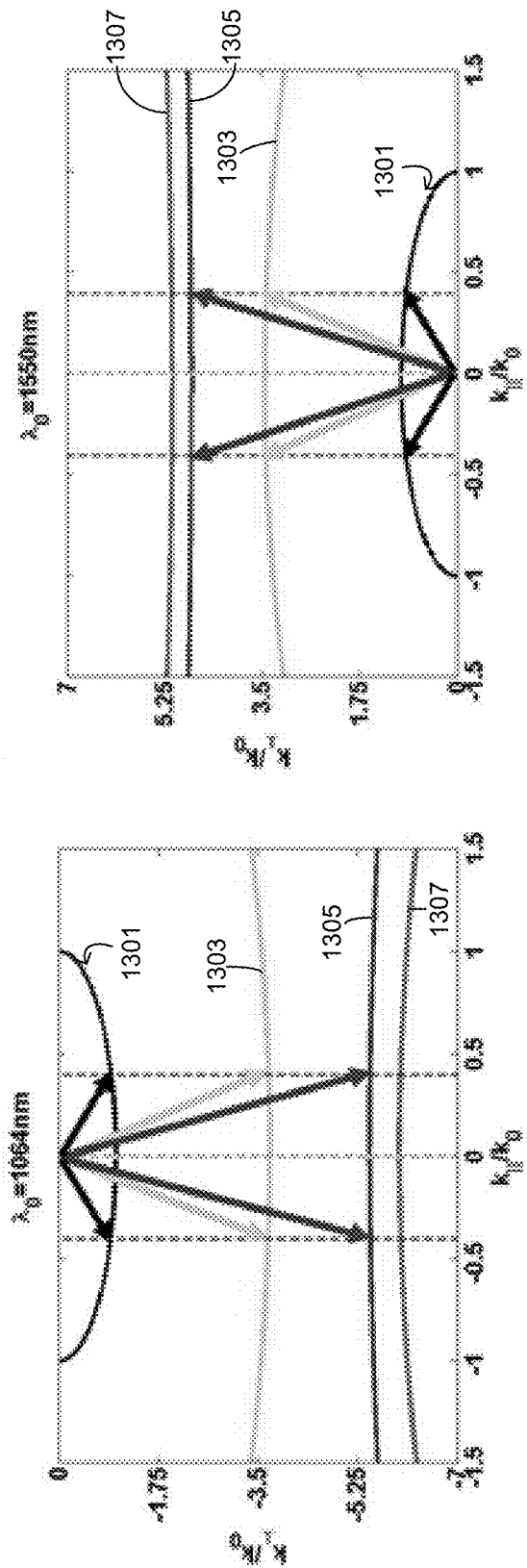
FIG. 13C
FIG. 13B

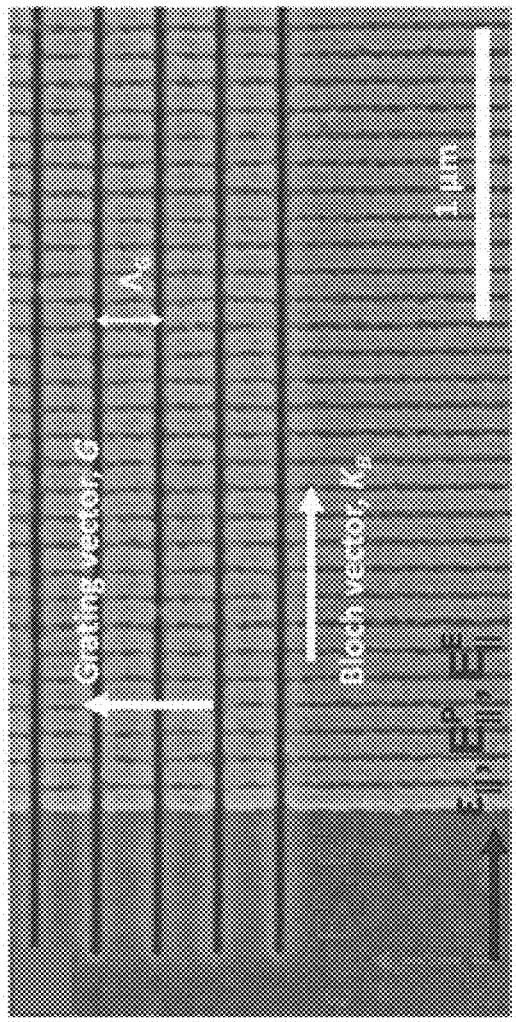
FIG. 15A
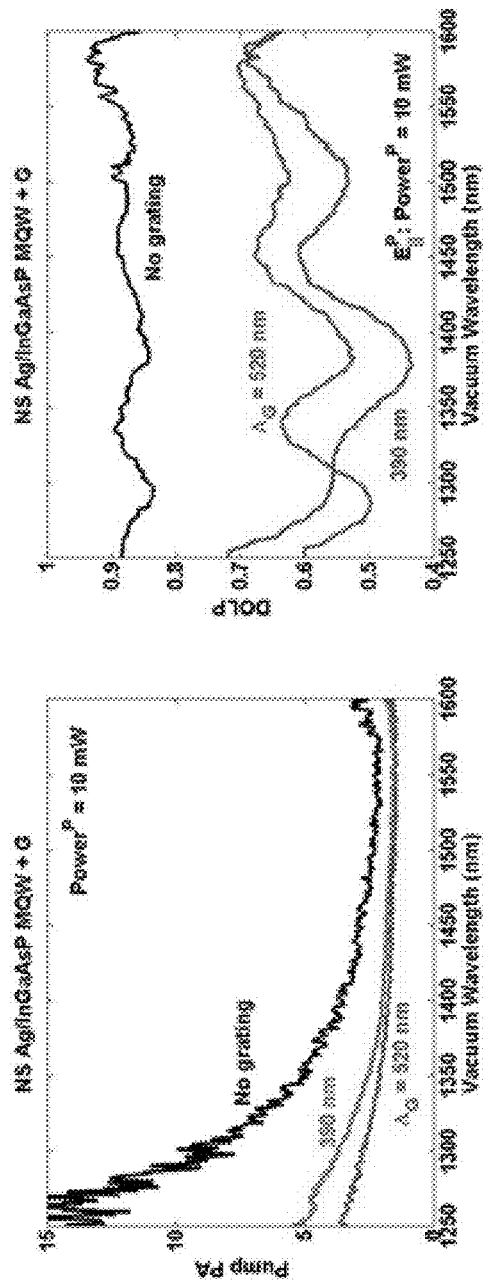
FIG. 15B
FIG. 15C

2000

2002 — grow a multi-layer quantum structure on a substrate, wherein the multi-layer quantum structure includes alternative layers of a barrier material followed by a layer of a semiconductor material to produce multiple quantum wells, the multiple quantum wells separated by the alternative layers of the barrier material 2004 — use a mask to etch the multi-layer quantum structure to create a plurality of quantum heterostructures, wherein each of the plurality of quantum heterostructures is separated from another quantum heterostructure by a gap 2006 — deposit a monocrystalline material to at least partially fill the gap between each of the plurality of quantum heterostructures

FIG. 20

LUMINESCENT HYPERBOLIC METASURFACES

CROSS REFERENCE TO RELATED APPLICATIONS

This patent document claims the priority and benefit of U.S. Provisional Patent Application No. 62/395,869 entitled "LUMINESCENT HYPERBOLIC METASURFACES" and filed on Sep. 16, 2016. The entire content of the before-mentioned patent application is incorporated by reference as part of the disclosure of this document.

STATEMENT REGARDING FEDERALLY SPONSORED RESEARCH OR DEVELOPMENT

This invention was made with government support under grant no. ECCS-1229677 awarded by the National Science Foundation (NSF), along with grant no. N00014-13-1-0678, awarded by the Office Of Naval Research (ONR). The government has certain rights in the invention.

TECHNICAL FIELD

This patent document relates to systems, devices, and processes for light-emitting metasurfaces.

BACKGROUND

Metasurfaces, such as hyperbolic metasurfaces, combine the properties of hyperbolic dispersion with the potential for chip-scale integration offered by planar metasurfaces. The extreme anisotropy and large, broadband optical density of states associated with hyperbolic media enable hyper-imaging, enhanced and directional spontaneous emission, super-Planckian heat transfer, ultrafast modulation, and efficient higher harmonic generation.

SUMMARY

Techniques, systems, and devices are disclosed for implementing light-emitting hyperbolic metasurfaces.

In one exemplary aspect, a semiconductor device is disclosed. The device includes a substrate; and luminescent hyperbolic metasurfaces (LuHMS). The luminescent hyperbolic metasurfaces include a plurality of quantum heterostructures, each of the plurality of quantum heterostructures including multiple quantum wells that are separated by multiple quantum barriers, wherein each of the plurality of quantum heterostructures is separated from another quantum heterostructure by a gap; and a monocrystalline material at least partially filling the gap between each of the plurality quantum heterostructures.

In some embodiments, the substrate includes indium phosphide. In some implementations, the multiple quantum barriers include indium gallium arsenide phosphide. In some embodiments, the multiple quantum wells include indium gallium arsenide phosphide. In some embodiments, the monocrystalline material includes silver.

In some embodiments, each of the plurality of quantum heterostructures has a shape of a pillar. For example, each of the plurality of quantum heterostructures may have a height between 100 to 300 nm and a width between 40 to 80 nm. In some implementations, the gap has a width between 10 to 40 nm.

In some embodiments, the plurality of quantum heterostructures and the monocrystalline material form a periodic structure having a sub-wavelength pitch that is 15 to 20 times smaller than a vacuum emission wavelength of the multiple quantum wells. In some embodiments, the device also includes a plurality of grating couplers to control a pump polarization anisotropy of the device.

In another exemplary aspect, a method for fabricating a semiconductor device is disclosed. The method includes growing a multi-layer quantum structure on a substrate, wherein the multi-layer quantum structure includes alternative layers of a barrier material followed by a layer of a semiconductor material to produce multiple quantum wells, the multiple quantum wells separated by the alternative layers of the barrier material; using a mask to etch the multi-layer quantum structure to create a plurality of quantum heterostructures, wherein each of the plurality of quantum heterostructures is separated from another quantum heterostructure by a gap; and depositing a monocrystalline material to at least partially fill the gap between each of the plurality of quantum heterostructures.

In some embodiments, the method also includes developing the mask over the multi-layer quantum structure prior to the etching of the multi-layer quantum structure, wherein the mask includes hydrogen silsesquioxane; and removing the mask from the multi-layer quantum structure.

In some embodiments, the substrate includes indium phosphide. In some implementations, the barrier material includes indium gallium arsenide phosphide. In some embodiments, the multiple quantum wells include indium gallium arsenide phosphide. In some implementations, the monocrystalline material includes silver.

In some embodiments, each of the plurality of quantum heterostructures has a shape of a pillar. For example, each of the plurality of quantum heterostructures may have a height between 100 to 300 nm and a width between 40 to 80 nm. In some implementations, the gap has a width between 10 to 40 nm.

In some embodiments, the plurality of quantum heterostructures and the monocrystalline material form a periodic structure having a sub-wavelength pitch that is 15 to 20 times smaller than a vacuum emission wavelength of the multiple quantum wells.

The above and other aspects and their implementations are described in greater detail in the drawings, the descriptions, and the claims.

BRIEF DESCRIPTION OF THE DRAWINGS

FIG. 2A shows an example of InGaAsP MQW pillars of 100 nm height and 40 nm width.

FIG. 2B shows an example of Ag deposited by sputtering and/or partially filling the trenches to create a multilayer LuHMS with 80 nm period.

FIG. 2C shows an example of optical pumping of LuHMS.

FIG. 10A shows an exemplary model of luminescent hyperbolic metasurfaces (LuHMS) using a nanostructure.

FIG. 10B shows exemplary results of emission simulation at a wavelength of 1064 nm.

FIG. 10C shows an exemplary model of LuHMS using effective medium approximation (EMA).

FIG. 10D shows exemplary results of emission simulation at a wavelength of 1350 nm.

FIG. 11A shows an exemplary plot of absorption of parallel and normal-polarized pump for period lengths from 20 nm to 800 nm and constant Ag fraction of $\rho=0$.

FIG. 11B shows an exemplary single parallel polarized Bloch mode below a critical period length.

FIG. 13A shows a schematic diagram of a LuHMS.

FIG. 13B shows an exemplary wave-vector diagram of LuHMS at $\lambda_0=1064$ nm.

FIG. 13C shows an exemplary wave-vector diagram of LuHMS at $\lambda_0=1550$ nm.

FIG. 15A shows an exemplary LuHMS fabricated with wavelength-scale grating couplers.

FIG. 15B shows exemplary PL measurements of LuHMS fabricated with wavelength-scale grating couplers.

FIG. 15C shows exemplary DOLP from LuHMS fabricated with wavelength-scale grating couplers.

FIG. 20 is a flowchart representation of a method for fabricating a light-emitting device.

DETAILED DESCRIPTION

Section headings are used in the present document for the ease of understanding and do not limit the disclosed technology in any way. The term "exemplary" is used to mean "an example of" and does not necessarily refer to the described technology as being ideal or preferred.

As noted earlier, hyperbolic metasurfaces enable a wide range of features and benefits such as hyper-imaging, ultra-fast modulation, efficient higher harmonic generation, and others. Despite use of single-crystalline silver (Ag), which has low losses in the visible and near infrared red (IR) wavelength ranges, hyperbolic metasurfaces (HMS) remain inherently lossy, limiting potential applications. While studies have proposed using gain to offset losses, bulk hyperbolic metamaterials (HMM) have incorporated light emitters only in addition to their constituent metallic and dielectric components. This patent document discloses luminescent hyperbolic metasurfaces (LuHMS), in which semiconductor quantum heterostructures, distributed within the entire HMM, simultaneously function as light-emitters and the constituent dielectric. The unique design of the LuHMS maximizes light-matter interactions and enables verification of broadband hyperbolic dispersion by extreme polarization anisotropy of photoluminescence. Furthermore, efficient extraction of in-plane surface modes is achieved without the need of a grating coupler.

For most natural materials, polarization anisotropy (PA) is weak but nonetheless useful. For example, PA forms the basis for fluorescence spectroscopy upon which many scientific techniques rely. In engineered metamaterials, PA may be much more pronounced, including for light incident upon, and emitted from, subwavelength-structured surfaces. In materials exhibiting hyperbolic dispersion, PA becomes extreme, as the material behaves simultaneously as a metal and dielectric for waves of orthogonal polarization states.

This patent document describes various features associated with extremely anisotropic LuHMS that includes alternating layers of silver (Ag) and indium gallium arsenide phosphide (InGaAsP) multiple quantum wells (MQW).

Figure 1A:
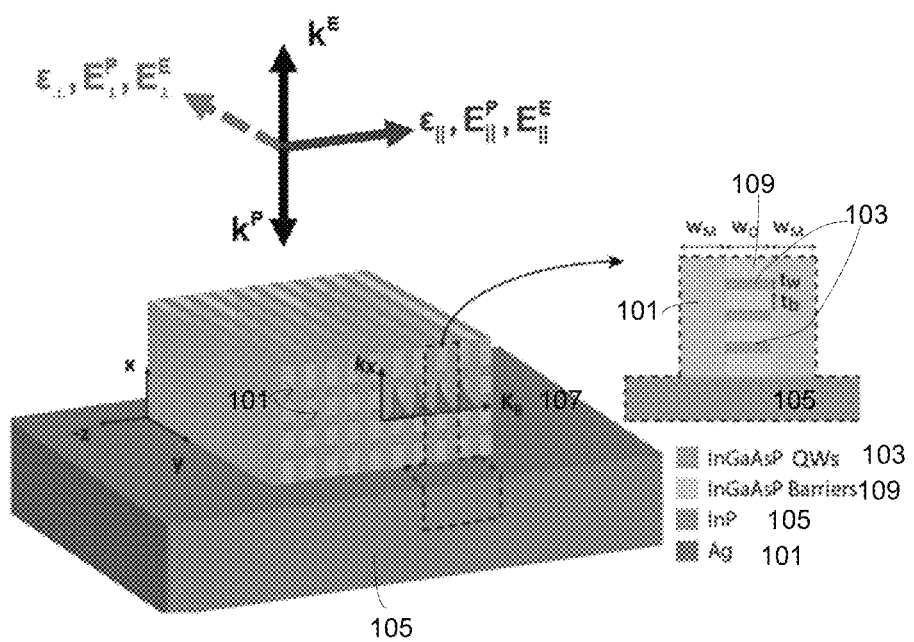
FIG. 1A shows an exemplary schematic of multiple layers of silver (Ag) and indium gallium arsenide phosphide (InGaAsP) multiple quantum wells (MQW) structure atop an indium phosphide (InP) substrate.
Figure 1B:
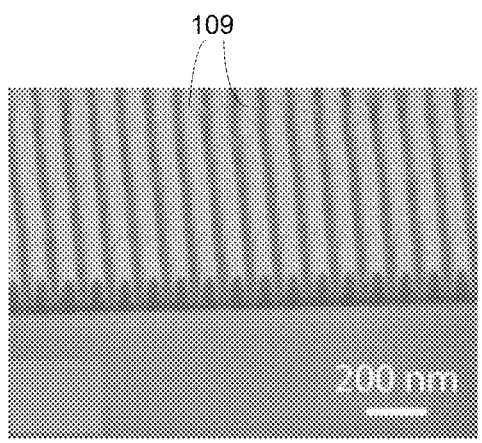
FIG. 1B shows an example of InGaAsP MQW after etching in 200 nm scale.
Figure 1C:
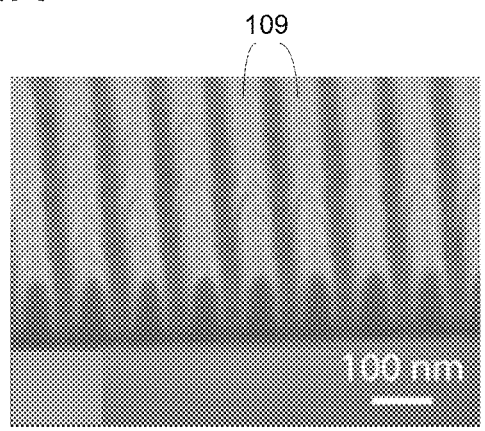
FIG. 1C shows an example of InGaAsP MQW after etching in 100 nm scale.
Figure 1D:
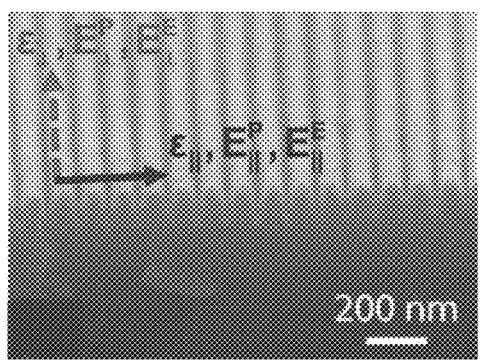
FIG. 1D shows an example Ag/InGaAsP MQW after sputtering of Ag in 200 nm scale.
Figure 1E:
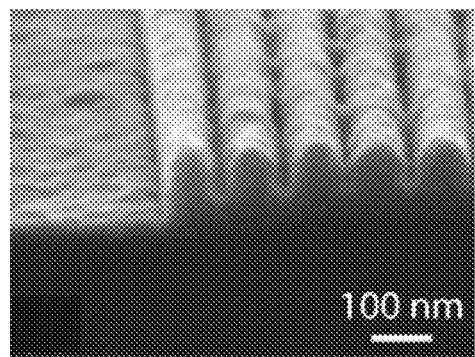
FIG. 1E shows an example of Ag/InGaAsP MQW after sputtering of Ag in 100 nm scale.

FIG. 1A shows an exemplary schematic of HMS. The HMS includes multiple layers of silver (Ag) 101 and indium gallium arsenide phosphide (InGaAsP) 109 with multiple quantum wells (MQW) 103 atop an indium phosphide (InP) substrate 105. A Bloch vector, $K_B$ (107) directed normal to the MQW growth direction, and pump and emission polarized either parallel, ($E_\parallel^P$, $E_\parallel^E$), or normal, ($E^{\perp P}$, $E^{\perp E}$), to $K_B$. Fabrication of the HMS may begin with electron-beam lithography and reactive ion etching to form 40 nm wide and 100 nm tall InGaAsP pillars, separated by 40 nm trenches, as shown in FIG. 1B and FIG. 1C. The trenches can then be at least partially filled with Ag, sputtered at ultra-low vacuum, to form a multilayer HMS with an 80 nm period, as shown in FIG. 1D and FIG. 1E, 15 to 20 times smaller than the emission wavelength of the MQW.

FIGS. 2A-C show an exemplary Luminescent hyperbolic metasurface (LuHMS) based on nanostructured Ag/InGaAsP MQW. In FIG. 2A, InGaAsP MQW pillars of 100 nm height and 40 nm width, separated by 40 nm trenches, are defined by electron-beam lithography and reactive ion etching. After etching, in some embodiments as shown in FIG. 2B, Ag 201 can be blanket-deposited by sputtering, partially filling the trenches to form alternating nanostructured Ag/InGaAsP (205) with MQW (203) layers. The period of a unit cell of the system is AB and is approximately 80 nm, which is 15 to 20 times smaller than the vacuum emission wavelength of the constituent MQW (203), and therefore suitable for description by the effective medium approximation (EMA).

The EMA is a powerful tool for gaining intuition about complex composite media. The EMA may transform the periodic, inhomogeneous Ag/InGaAsP system into an anisotropic, homogeneous material, with properties governed by those of the constituent materials and their respective ratio. Under both Bloch's theorem and the EMA, the Ag/InGaAsP system exhibits hyperbolic dispersion for a wide range of ratios throughout the telecommunication and near-infrared frequency range.

The fabricated structure can be approximated as a one-dimensional infinitely periodic system. Bloch's theorem may then be invoked to determine the range of transverse momentum states supported by the system, $\Delta k_\perp$. This is done by solving for the Bloch vector, $K_B$, of the system:

$$K_B = -\frac{1}{a}\cos^{-1}\left(\frac{A+D}{2}\right) + \frac{2\pi}{a}s, \quad s = 0, 1, 2 \ldots \quad \text{Eq. (1)}$$

where $$A = \exp(ik_{\parallel,M}t_M)\cos(k_{\parallel,D}t_D) + \frac{1}{2}i\left(\frac{\varepsilon_D k_{\parallel,M}}{\varepsilon_M k_{\parallel,D}} + \frac{\varepsilon_M k_{\parallel,D}}{\varepsilon_D k_{\parallel,M}}\right)\sin(k_{\parallel,D}t_D) \quad \text{Eq. (2)}$$

$$D = \exp(-ik_{\parallel,M}t_M)\cos(k_{\parallel,D}t_D) - \frac{1}{2}i\left(\frac{\varepsilon_D k_{\parallel,M}}{\varepsilon_M k_{\parallel,D}} + \frac{\varepsilon_M k_{\parallel,D}}{\varepsilon_D k_{\parallel,M}}\right)\sin(k_{\parallel,D}t_D) \quad \text{Eq. (3)}$$

In Eq. (1), a is the length of one period, equal to the sum of the Ag and InGaAsP layer thicknesses, $t_M$ and $t_D$, respectively. In Eqs. (2)-(3), the complex, frequency dependent dielectric function of Ag, $\varepsilon_M$, is based on experimental data, whereas that of InGaAsP, $\varepsilon_D$, is based on a combination of experimental and theoretical data. Furthermore, $\varepsilon_D$ also depends upon the free carrier density, N, which is controlled by external pumping. The longitudinal wave components within the Ag and InGaAsP layers, $k_{\parallel,M}$ and $k_{\parallel,D}$, respectively, are related to the conserved transverse component, $k_\perp$, and vacuum wavenumber, $k_0 = 2\pi/\lambda_0$ by:

$$k_0 = 2\pi/\lambda_0 \quad \text{Eq. (4)}$$

$$k_{\parallel,D} = \sqrt{\varepsilon_D k_0^2 - k_\perp^2} \quad \text{Eq. (5)}$$

It has been verified that $t_M \approx t_D \approx 40$ nm. However, to account for sample non-uniformities, the material ratio, $\rho = t_M/t_D$, is allowed to vary, while the period is fixed to a=80 nm. The zeroth-order EMA of Eq. (1) is:

$$k_{B,EMA} = -\sqrt{\varepsilon_\perp\left(1 - \frac{k_\perp^2}{\varepsilon_\parallel}\right)} \quad \text{Eq. (6)}$$

where $$\varepsilon_\perp = \rho\varepsilon_M + (1-\rho)\varepsilon_D = \varepsilon'_\perp + i\varepsilon''_\perp \quad \text{Eq. (7)}$$

$$\varepsilon_\perp = \rho\varepsilon_M + (1-\rho)\varepsilon_D = \varepsilon'_\perp + i\varepsilon''_\perp \quad \text{Eq. (8)}$$

Figure 3A:
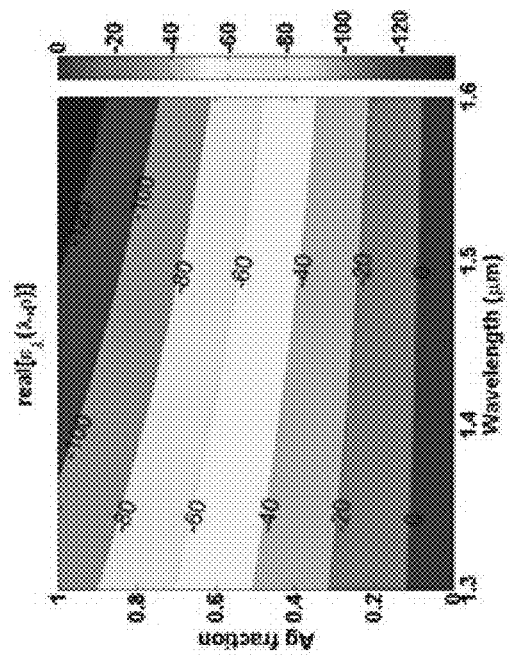
FIG. 3A shows an example of real parts of effective permittivity elements parallel to a metacrystal Block vector $K_B$.
Figure 3B:
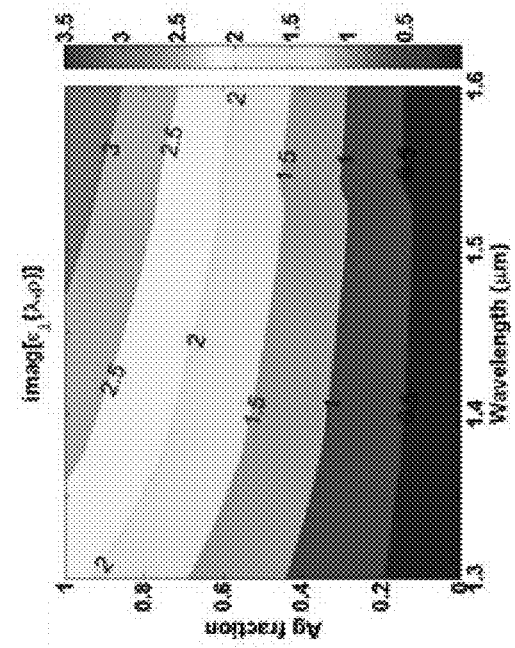
FIG. 3B shows an example of real parts of effective permittivity elements normal to a metacrystal Block vector $K_B$.
Figure 3C:
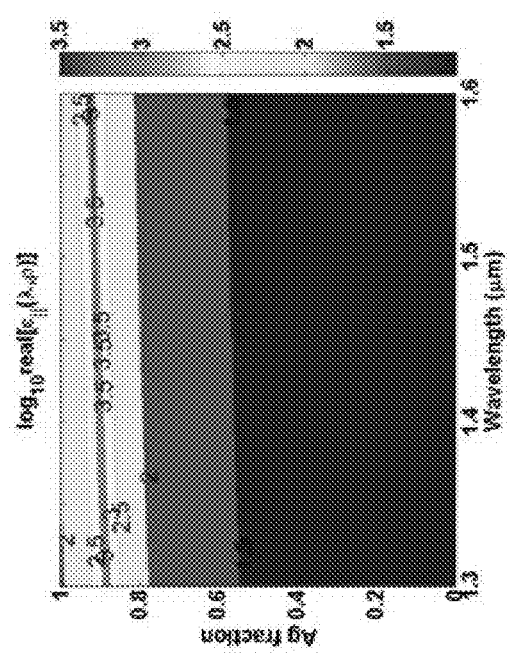
FIG. 3C shows an example of imaginary parts of effective permittivity elements parallel to a metacrystal Block vector $K_B$.
Figure 3D:
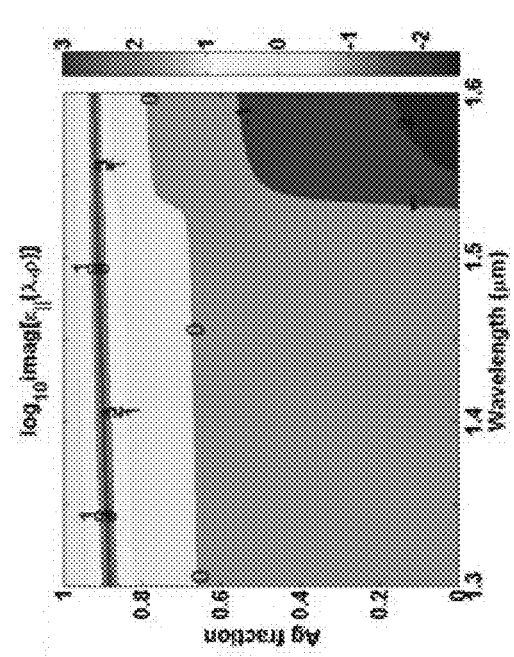
FIG. 3D shows an example of imaginary parts of effective permittivity elements normal to a metacrystal Block vector $K_B$.

In Eq. (6) the negative root is selected because the condition $\varepsilon'_\perp k_{B,EMA} > 0$ is required to satisfy the causality constraint. To most clearly illustrate the broadband hyperbolic dispersion of the Ag/InGaAsP system, FIGS. 3A and 3B show the real parts of the effective permittivity elements parallel and normal to $K_B$, respectively. Hyperbolic dispersion exists for all values of (λ,ρ) such that $\varepsilon'_{\parallel}\varepsilon'_{\perp}<0$, which occurs throughout the plotted parameter space except for p<0.1. Two primary sources of losses in the system are evident from FIGS. 3C and 3D, which show the imaginary parts of the effective permittivity elements parallel and normal to $K_B$, respectively, with $N=1\times10^{16}$ cm$^{-3}$. As the Ag fraction increases, Ohmic losses increase. Absorption at the band-edge of InGaAsP MQW also leads to an abrupt increase in losses at λ≈1.55 μm.

Figures 4A, 4B, 4C, 4D, 4E, 4F:
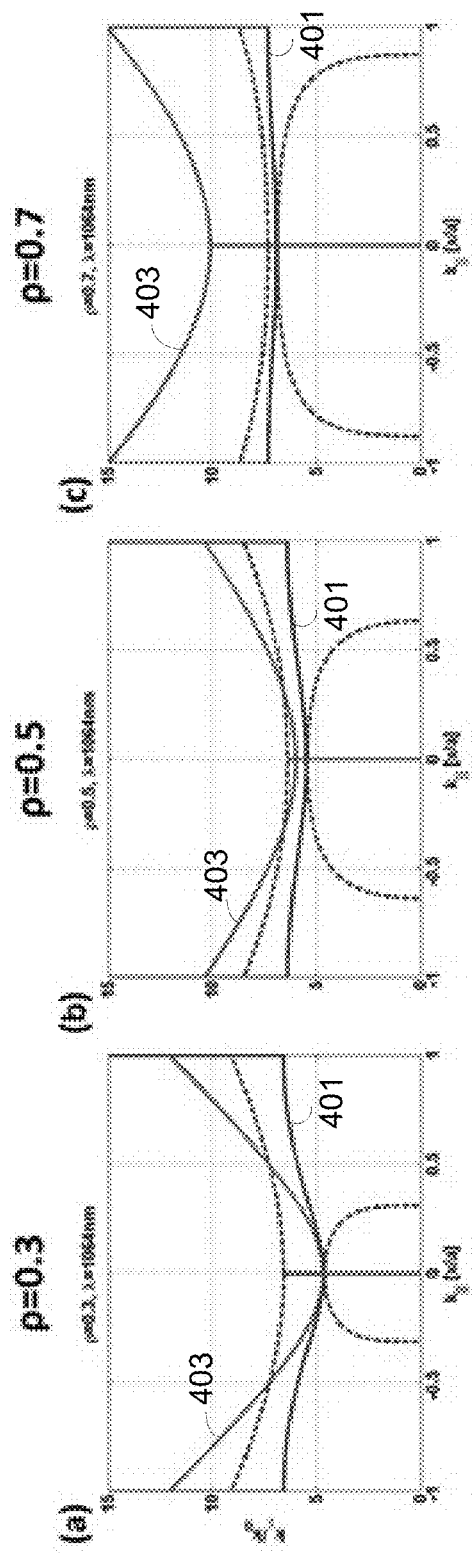
FIG. 4A shows an exemplary plot for a silver (Ag) fraction of $\rho=0.3$ at a pump wavelength of $\lambda_0=1064$ nm.
FIG. 4B shows an exemplary plot for an Ag fraction of $\rho=0.5$ at a pump wavelength of $\lambda_0=1064$ nm.
FIG. 4C shows an exemplary plot for an Ag fraction of $\rho=0.7$ at a pump wavelength of $\lambda_0=1064$ nm.
FIG. 4D shows an exemplary plot for an Ag fraction of $\rho=0.3$ at an emission wavelength of $\lambda_0=1550$ nm.
FIG. 4E shows an exemplary plot for an Ag fraction of $\rho=0.5$ at an emission wavelength of $\lambda_0=1550$ nm.
FIG. 4F shows an exemplary plot for an Ag fraction of $\rho=0.7$ at an emission wavelength of $\lambda_0=1550$ nm.

FIG. 4 shows the solutions to Eq. (1) and (6) with losses omitted, for ρ=0.3, ρ=0.5, and ρ=0.7 at the pump wavelength of $\lambda_0$=1064 nm and emission wavelength of $\lambda_0$=1550 nm. The solid (dashed) blue curves (401) correspond to real (imaginary) parts of $K_B$, whereas the red curves (403) correspond to the purely real $k_{B,EMA}$. Optical states with transverse momentum exceeding that of the constituent MQW, $k_\perp/k_0>3.5$, are clearly present. As the wavelength increases from 1064 nm to 1550 nm, the EMA more closely matches the complete solution, as expected. For all wavelengths, the EMA performs best at $K_{B=0}$, also as expected for a local (zeroth order) theory. As the Ag ratio increases, the EMA becomes poor, especially at the pump wavelength. Nonetheless, the existence of non-zero real solutions to Eq. (1) shows that the Ag/InGaAsP MQW system supports hyperbolic dispersion over a large region of the Ag fraction-wavelength parameter space, covering the wavelengths of the pump and all MQW emission.

Using the EMA, the linear optical response of the LuHMS can be described with the diagonal effective permittivity tensor, $\bar\varepsilon=[\varepsilon_\perp, 0, 0; 0, \varepsilon_\perp, 0; 0, 0, \varepsilon_\parallel]$, with tensor elements defined with respect to the metacrystal Bloch vector, $K_B$, as shown in FIG. 2C. The HMS behaves as a semiconductor and metal when the pump is polarized parallel and normal to the Bloch vector, respectively.

In the wavelength range of interest, 1000 nm<$\lambda_0$<1600 nm, the tensor elements have the following properties in the absence of external pumping.

$$\varepsilon_\perp=\varepsilon'_\perp+i\varepsilon''_\perp, \varepsilon'_\perp<0, \varepsilon''_\perp>0 \quad \text{Eq. (9)}$$

$$\varepsilon_\parallel=\varepsilon'_\parallel+i\varepsilon''_\parallel, \varepsilon'_\parallel<0, \varepsilon''_\parallel>0 \quad \text{Eq. (10)}$$

In Eqs. (9)-(10) the single and double primes denote the real and imaginary parts, respectively, and the time-convention of exp(−iωt) has been chosen such that positive ε" indicates dissipation. Eqs. (1)-(2) state that the LuHMS resembles InGaAsP MQW, a strongly absorbing semiconductor, for waves polarized parallel to $K_B$, while it resembles Ag, a strongly scattering metal, for waves polarized normal to $K_B$. Under the influence of optical pumping, $\varepsilon''_\perp$ and $\varepsilon''_\parallel$ change dramatically, with $\varepsilon''_\parallel$ becoming negative for sufficiently large pump powers. Optical pumping of the LuHMS results in emission polarized predominantly parallel to $K_B$, shown schematically in FIG. 2C, regardless of pump polarization. As the pump polarization changes from normal to parallel, the wavelength of peak emission blue shifts and the integrated photoluminescence (PL) intensity increases due to a larger inversion density induced by parallel pumping. Emission from the LuHMS blue shifts as the pump polarization changes from normal to parallel due to increasing pump absorption. Additionally, PL spectra of the LuHMS differ significantly from that of control MQW, regardless of pump polarization, due to a wavelength and pump power dependence of the direction of energy propagation on the surface.

Exemplary Setup and Properties of Control InGaAsP MQW

Figure 5:
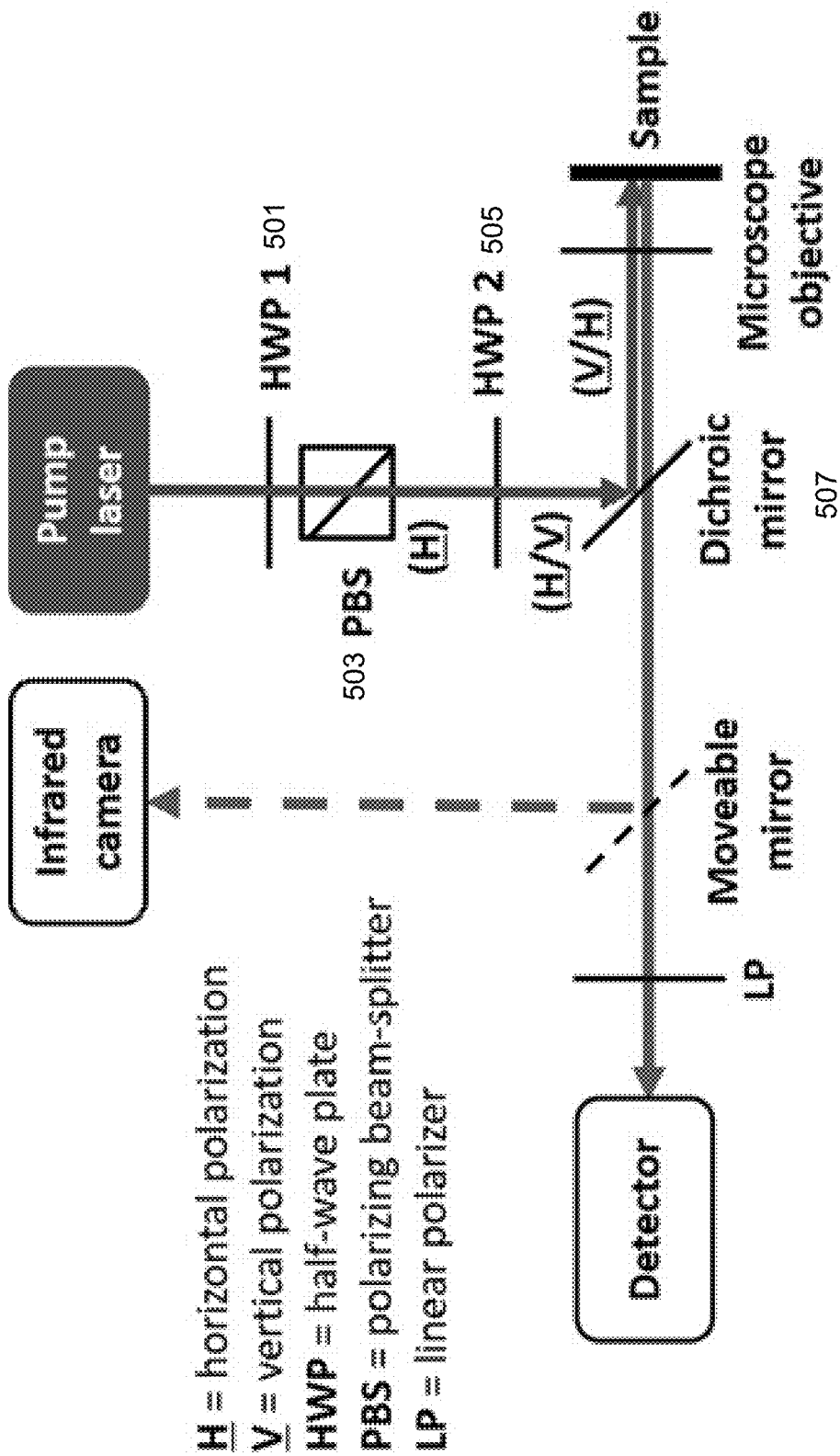
FIG. 5 shows a schematic diagram of an exemplary setup used for characterization of fabricated samples.

Hyperbolic dispersion of the fabricated LuHMS was verified by extreme PA of PL. FIG. 5 shows an exemplary schematic of the setup used for characterization of the fabricated samples. The half-wave plate closest to the pump (HWP 1) 501 was first rotated to maximize the horizontally polarized signal exiting the polarizing beam splitter (PBS) 503. HWP 2 (505) functioned as a variable polarization rotator. The dichroic mirror (DM) 507 also rotated the polarization state of the pump by a fixed 90°, such that the polarization state incident on the sample was normal to that exiting the HWP 2 (505). While the DM 507 reflected orthogonal polarization states exiting HWP 2 (505) almost equally, the pump transmission through the DM 507 was highly polarization dependent, differing by several orders of magnitude. Therefore the measured photoluminescence (PL) signal is relied on to indicate the effective pump absorption. To measure polarization of the PL, the PL was passed through a linear polarizer (LP) before reaching the detector. For measurements of total PL, the LP was removed. To remove inconsistencies associated with changing the focal plane of the sample, all samples were focused such that the detected signal at the wavelength of 1550 nm was maximized.

Figure 6B:
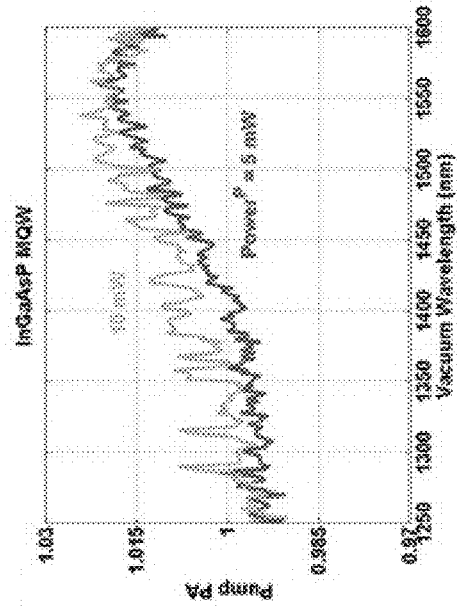
FIG. 6B shows an exemplary plot of pump polarization anisotropy (PA).
Figure 6D:
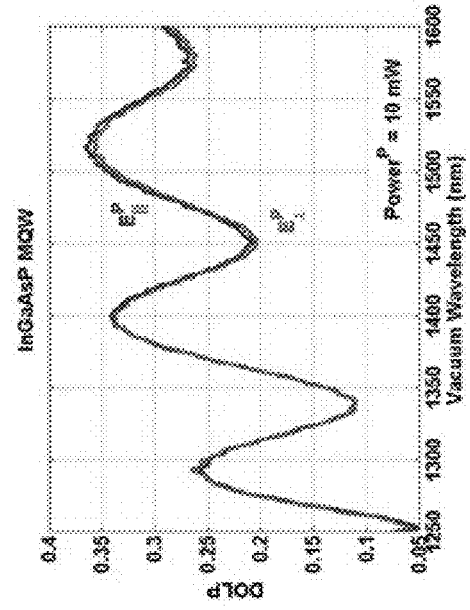
FIG. 6D shows an exemplary plot of a degree-of-linear-polarization (DOLP).
Figure 6A:
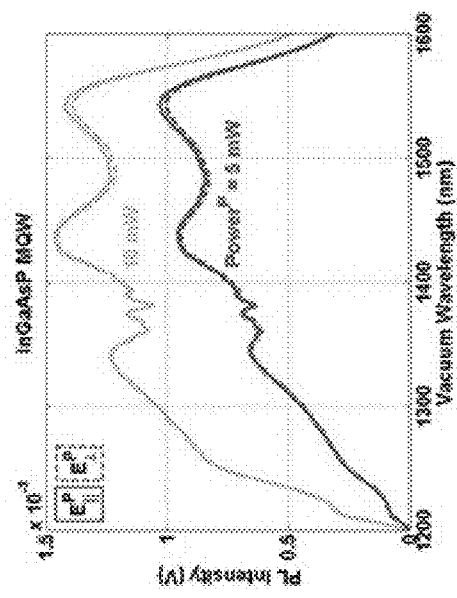
FIG. 6A shows an exemplary plot of a total photoluminescence (PL) induced by parallel and normal-polarized pumps at several pump powers.
Figure 6C:
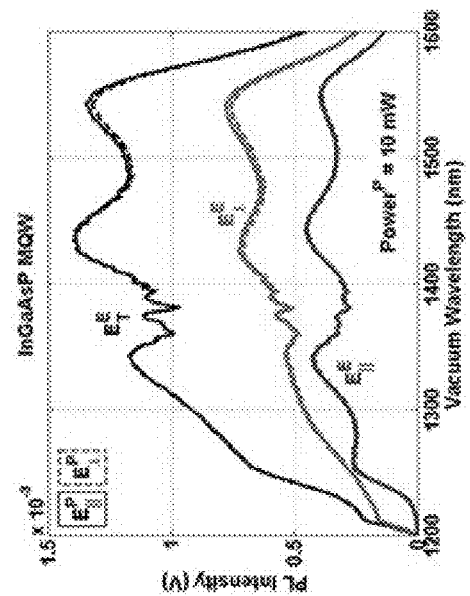
FIG. 6C shows an exemplary plot of a total PL, along with the PL resolved into parallel and normal polarization components.

The InGaAsP MQW wafer showed no pump polarization anisotropy, however, partially polarized emission was observed. FIG. 6A shows exemplary total PL induced by parallel and normal-polarized pumps at several pump powers. FIG. 6B shows the pump PA, which is close to unity over the entire spectrum, indicating that the PL is independent of pump polarization. FIG. 6C shows exemplary total PL, along with the PL resolved into parallel and normal polarization components. A clear difference is observed. The degree-of-linear-polarization (DOLP) quantifies this difference in FIG. 6D, which shows that the emission is predominantly normal polarized.

Figure 7B:
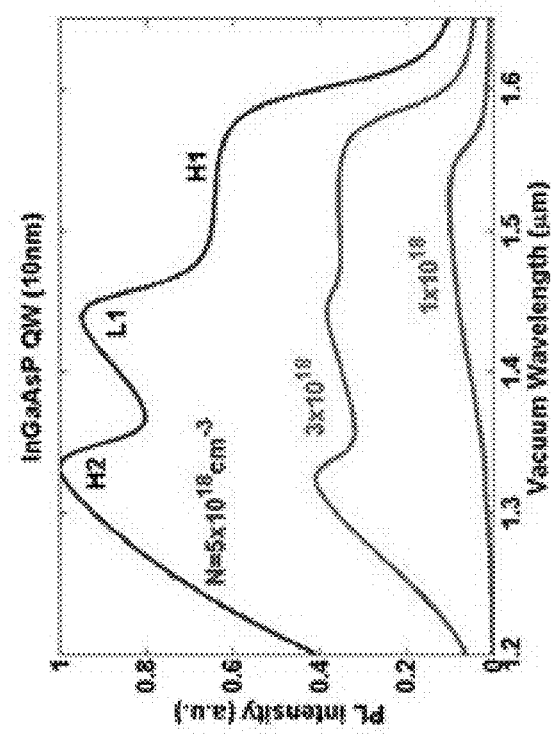
FIG. 7B shows an exemplary plot of a material gain for emission peaks at ~1550 nm, ~1450 nm, and ~1350 nm.
Figure 7A:
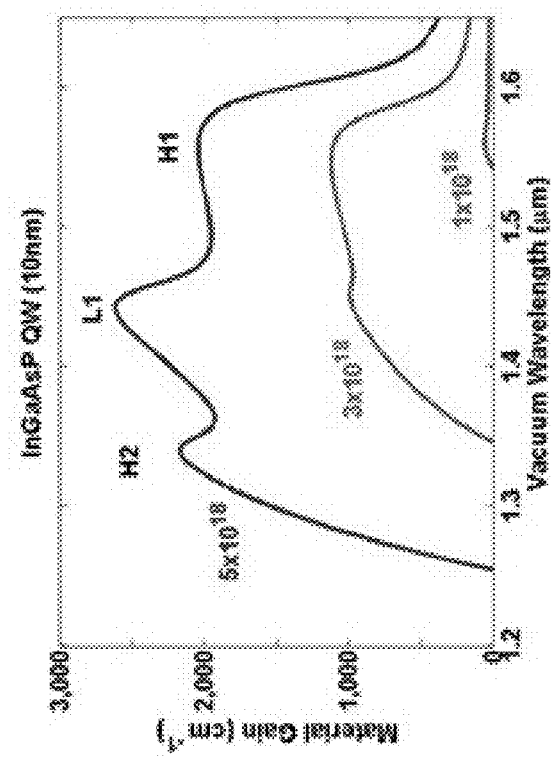
FIG. 7A shows an exemplary plot of a PL intensity for emission peaks at ~1550 nm, ~1450 nm, and ~1350 nm.

To understand the origin of the emission peaks, the spontaneous emission and gain spectra of a 10 nm InGaAsP QW was calculated. A valence band offset of 0.55($E_{G,B}-E_{G,W}$) was used where, $E_{G,B}$ and $E_{G,W}$ are the bandgap energies of the barrier and well materials, respectively, both depending on temperature and carrier density. FIGS. 7A-B show PL intensity and material gain for emission peaks at ~1550 nm, ~1450 nm, and ~1350 nm, which arise from transitions between the first conduction and heavy-hole, first conduction and light-hole, and second conduction and heavy-hole subbands, respectively. As the pumping strength is increased the spectra blue-shift due to filling of higher energy states. For pump powers used in some embodiments, the peak at 1550 nm dominates, indicating that experimental carrier densities do not exceed $3\times10^{18}$ cm$^{-3}$.

Figure 8A:
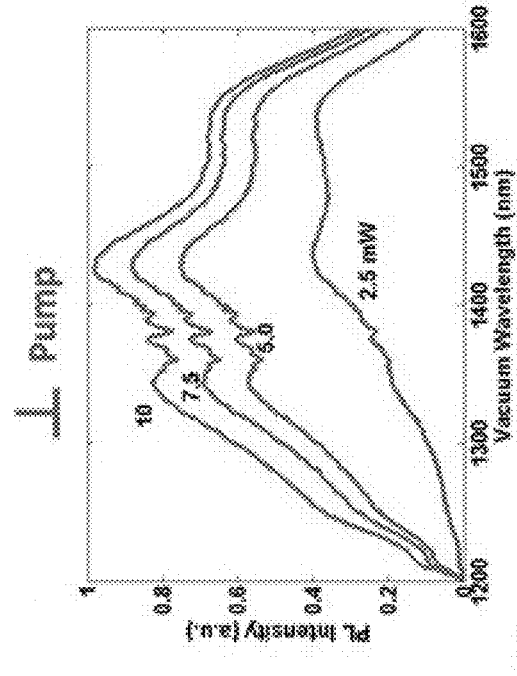
FIG. 8A show exemplary spectra of MQW prior to Ag deposition for parallel pump polarizations.
Figure 8B:
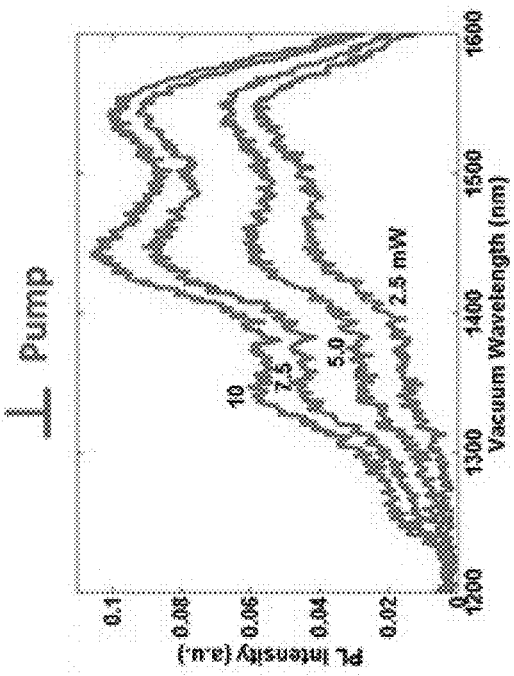
FIG. 8B show exemplary spectra of MQW prior to Ag deposition for normal pump polarizations.
Figure 8C:
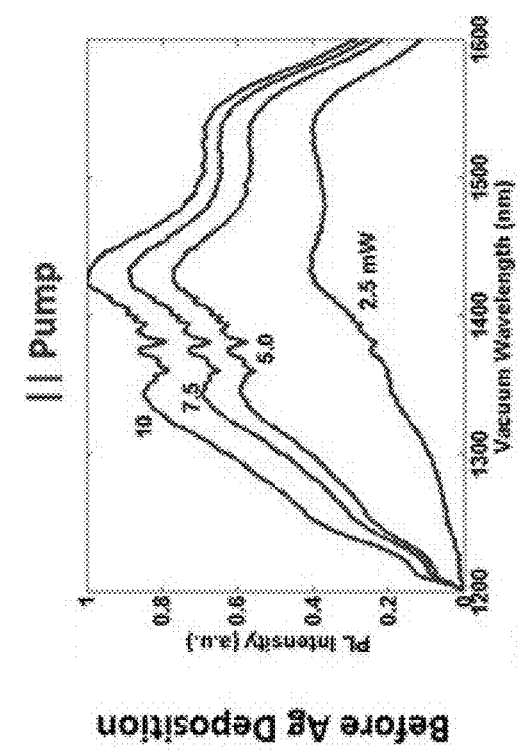
FIG. 8C show exemplary spectra of MQW after Ag deposition for parallel pump polarizations.
Figure 8D:
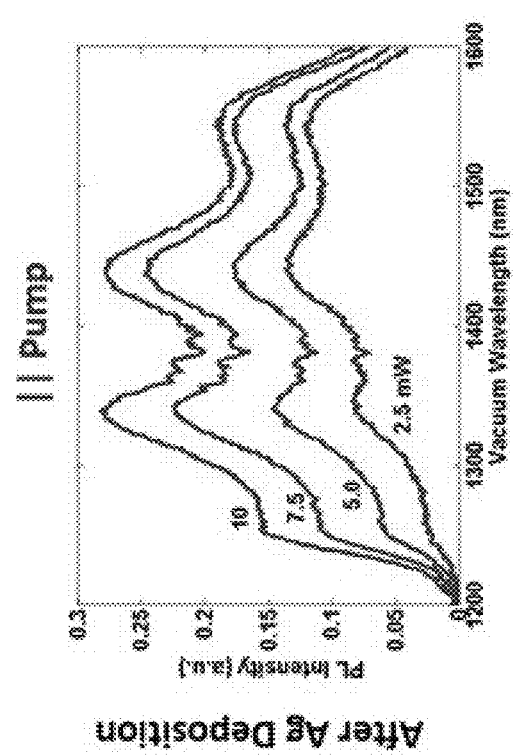
FIG. 8D show exemplary spectra of MQW after Ag deposition for normal pump polarizations.

Emission from the InGaAsP MQW after etching into nanostructures, but prior to Ag deposition, was characterized. FIGS. 8A-B show that the spectra of MQW prior to Ag deposition for parallel and normal pump polarizations are nearly identical, indicating that etching has negligible effect on the response of the material to different pump polarizations. After Ag deposition, however, the spectra show a strong dependence on pump polarization, as shown in FIGS. 8C-D. Therefore the presence of Ag, and the consequent hyperbolic dispersion, is necessary to achieve extreme polarization anisotropy.

Figure 9A:
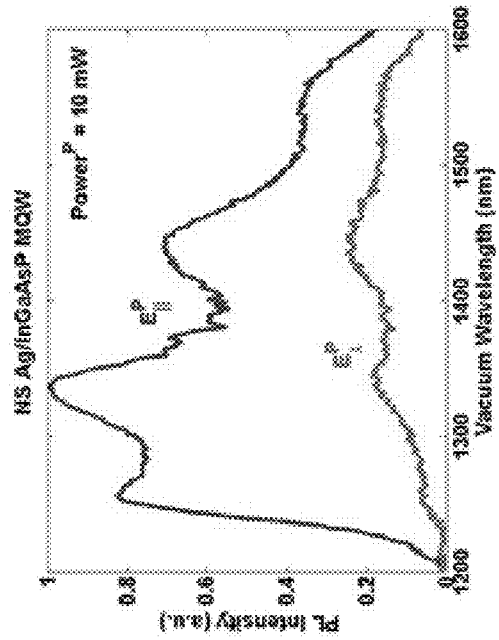
FIG. 9A shows an exemplary diagram of a PL signal for an emission wavelength of $\lambda_0=1350$ nm.
Figure 9B:
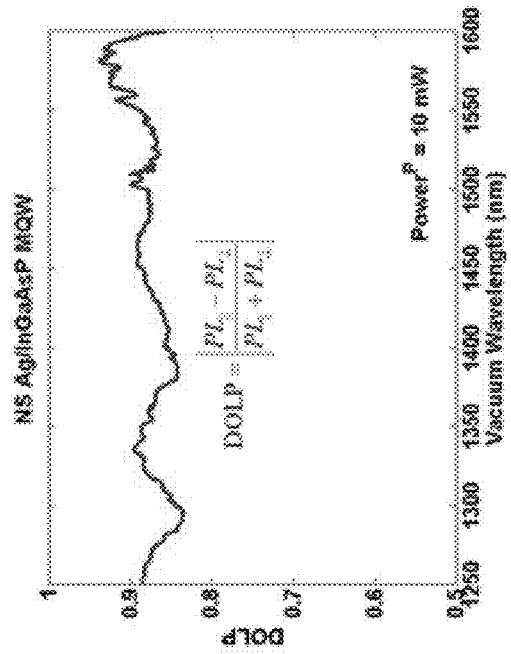
FIG. 9B shows an exemplary diagram of a PL signal for an entire spectrum.

In some embodiments, a linearly-polarized, pulsed Nd:YAG laser with vacuum wavelength of $\lambda_0$=1064 nm and maximum peak intensity of ~4.1 MW cm$^{-2}$ was used to photo-excite carriers in the MQW. FIGS. 9A-D demonstrates extreme polarization anisotropy in LuHMS. With the pump electric field polarized parallel (or normal) to $K_B$, $E_\parallel^P(E_\perp^P)$, the total PL signal reaches a maximum (or minimum), shown for the emission wavelength of $\lambda_0$=1350 nm in FIG. 9A and the entire spectrum in FIG. 9B. Maxima (or minima) are clearly observed when the pump is polarized parallel, $E_\parallel^P$, (or normal, $E_\perp^P$) to the metacrystal Bloch vector, $K_B$. In FIG. 9B, the total PL signal reaches a maximum (or a minimum) in the total PL spectra of the LuHMS for parallel and normal polarized pump. The shape of the spectra differ due to band-filling effects. The PL spectrum broadens and the wavelength of peak PL blue-shifts as the pump polarization changes from $E_\perp^P$ to $E_\parallel^P$. As the pump becomes more parallel-polarized, absorption increases, exciting carriers to higher energy states in the MQWs.

Numerical Simulations

Numerical finite-difference time-domain (FDTD, Lumerical®) simulations were performed at pump and emission wavelengths. The LuHMS was modeled both as the exact (as-fabricated) nanostructure and by the EMA, shown schematically in FIGS. 10A and 10C. The nanostructure (NS) shown in FIG. 10A includes a 100 nm tall and 40 nm wide InGaAsP pillar clad 1001 with a 20 nm tall and 10 nm wide Ag layer 1003, atop a 200 nm tall and 80 nm wide InGaAsP base 1005. Both materials have a frequency dependent, complex-valued permittivity. The EMA model includes a 300 nm tall and 80 nm wide effective medium 1007 assuming a Ag fraction of $\rho=0.5$. In both models periodic boundary conditions and matched layers are employed along the z-coordinate and x-coordinate, respectively. Pumping is simulated by a monochromatic plane wave of wavelength $\lambda=1064$ nm and polarization parallel or normal to the z-coordinate, which is parallel to the metacrystal Bloch vector KB. Results are shown in FIG. 10B. The calculated absorption anisotropies of 26 and 17 for the LuHMS modeled by the nanostructure and the EMA, respectively, are in excellent qualitative and good quantitative agreement with measured values of pump polarization anisotropy. The close agreement between NS and EMA models further validates the use of EMA in describing the LuHMS.

Emission is simulated similarly, but with a broadband plane wave source incident from the opposite direction. Results at the emission wavelength of 1350 nm are shown in FIG. 10D. The simulated DOLP is calculated as the transmission anisotropy and is seen to be in good qualitative agreement with the values.

To confirm that extreme anisotropy is an effect of hyperbolic dispersion and not a simple artefact independent of period size, pump behavior over a large range of period lengths was simulated. FIG. 11A shows an exemplary absorption of the parallel and normal-polarized pump for period lengths from 20 nm to 800 nm and constant Ag fraction of $\rho=0.5$. Anisotropy is strongest when the EMA is most valid and the Ag/InGaAsP system exhibits hyperbolic dispersion. As the period increases, the anisotropy becomes significantly smaller, confirming that the extreme anisotropy measured in the samples results from hyperbolic dispersion enabled by deeply subwavelength structuring. This is further explained by calculated the supported modes of the system, according to Bloch's Theorem. FIG. 11B shows, for the pump vacuum wavelength of 1064 nm, that only a single parallel (TM) polarized Bloch mode exists below a critical period length. As the period length increases, normal-polarized modes are supported, reducing the absorption anisotropy illustrated observed in FIG. 11A. Hence, deeply sub-wavelength periodicity, and hyperbolic dispersion in the effective medium limit, is required to observe extreme polarization anisotropy.

To increase absorption of normal-polarized pump absorption and PL emission, a wavelength-scale grating is designed based on, both, infinitely-extended multilayer and EMA models. FIG. 10B shows simulated absorption of parallel and normal polarized pumps as a function of grating depth for the Ag/InGaAsP system modeled in the EMA with a grating of period $\Lambda G=390$ nm. Pump PA decreases dramatically in the presence of a grating, consistent with our experimental observations. Similar results were found for different grating periods.

Figure 9C:
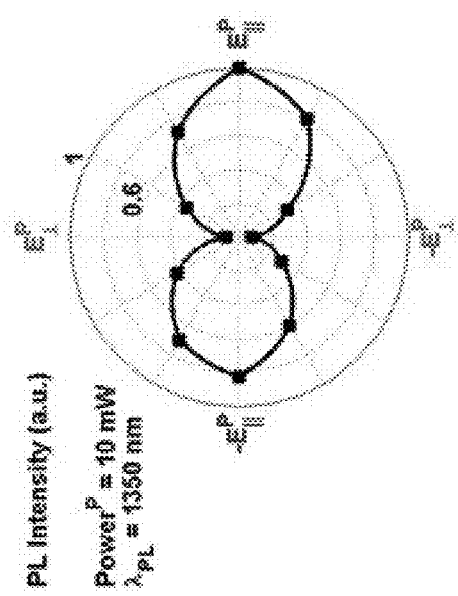
FIG. 9C shows an exemplary plot of pump polarization anisotropy (PA).

Numerical simulations confirm the observed extreme absorption anisotropy as well as the efficacy of the EMA. FIG. 9C shows the pump polarization anisotropy (PA), as the ratio of PL generated by the parallel and normal polarized pumps, showing pump PA of total emission calculated from FIG. 9B. The pump PA increases with frequency due to band-filling associated with the more efficiently absorbed pump polarization. The nonlinear dependence of PA on wavelength reflects a combinatorial effect of directional propagation associated with enhanced optical density of states as well as filling of the electronic density of states according to the Pauli Exclusion Principle.

Directional Propagation Properties of LuHMS

Figure 12A:
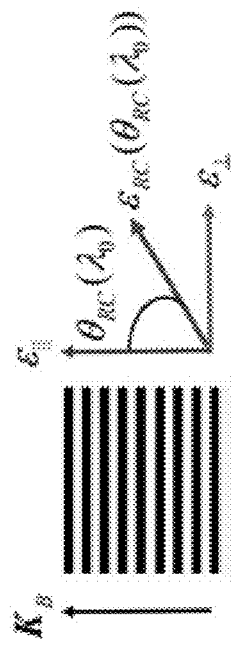
FIG. 12A shows a schematic diagram of a multilayer structure.
Figure 12B:
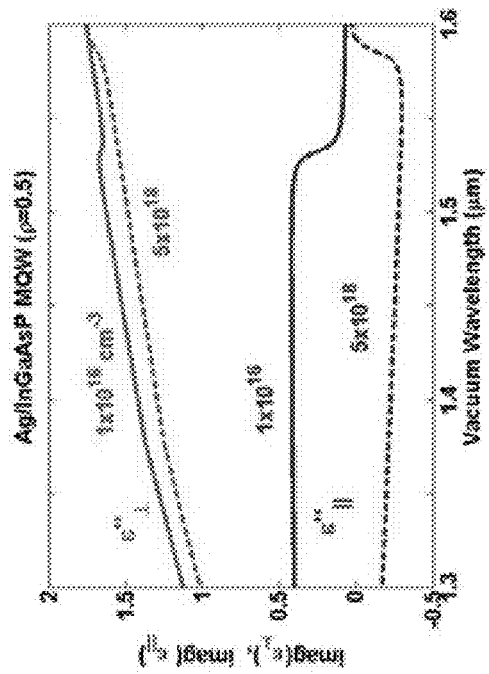
FIG. 12B shows an exemplary plot of dispersion of an imaginary effective permittivity.
Figure 12C:
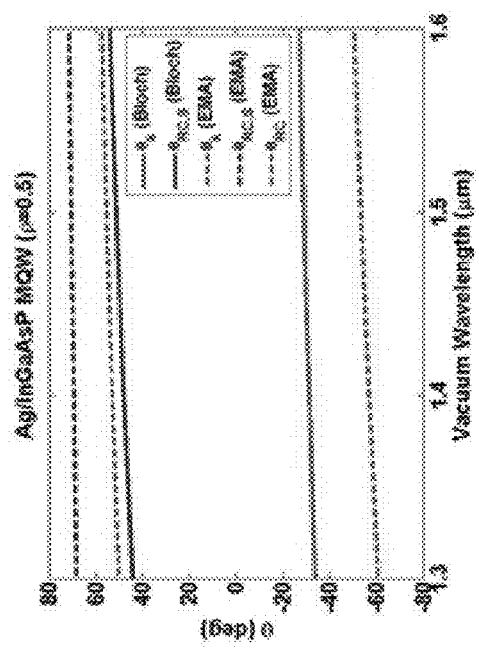
FIG. 12C shows an exemplary plot of wavelength dependences.

Energy propagation in media with hyperbolic dispersion is highly directional, forming resonance cones. The resonance cone half-angle determines the principal direction of energy propagation and, in the EMA, is defined as:

$$\theta_{RC} = \tan^{-1}\left(\sqrt{-\frac{\varepsilon_\perp}{\varepsilon_\parallel}}\right) \qquad \text{Eq. (11)}$$

where the angle is measured relative to the metacrystal axis. The half-angle may also be directly described with the Poynting vector, $$\theta_{RC,S} = \tan^{-1}\left(\frac{S_\perp}{S_\parallel}\right) = \tan^{-1}\left(\frac{k_\perp}{\varepsilon_\parallel} \Big/ \frac{k_\parallel}{\varepsilon_\perp}\right) \qquad \text{Eq. (12)}$$

where the parallel wave vector component is calculated by EMA or Bloch's theorem. On the other hand, the principle direction of the wave vector is given by $$\theta_k = \tan^{-1}\left(\frac{k_\perp}{k_\parallel}\right) \qquad \text{Eq. (13)}$$

which is known to be counterposed to the Poynting vector in media with hyperbolic dispersion. FIG. 12A shows a schematic diagram of the multilayer structure, defining the resonance cone angle and effective permittivity at this angle. In FIG. 12B the dispersion of the imaginary effective permittivity is shown, while in FIG. 12C the wavelength dependence of Eqs. (11)-(13) for the LuHMS made of Ag and InGaAsP MQW is shown. Regardless of the technique used to calculate the resonance cone angle, the angle of principal energy flow increases monotonically with wavelength, indicating a mechanism for the observed difference in PL spectra of the LuHMS relative to the control MQW. As the angle increases, the wave is directed more normal to the metacrystal axis and therefore experiences more attenuation. Relative to the control MQW, shorter wavelengths are more likely to be detected because they propagate closer to the metacrystal axis and therefore experience less attenuation than longer wavelengths. For convenience, the dispersion of the imaginary effective permittivity elements are shown in FIG. 12B from which the effect of directionality can be quantitatively estimates.

The attenuation, α, of a plane wave is directly proportional to the imaginary part of the permittivity. From an elementary model of QW assuming parabolic conduction and valence bands, an effective attenuation can be calculated using the following relation:

$$\alpha_{RC}(\theta_{RC}) = k_0 \frac{\varepsilon''_{RC}(\theta_{RC})}{\sqrt{\varepsilon'_D}} \quad \text{Eq. (14)}$$

where $$\varepsilon''_{RC}(\theta_{RC}) = \sqrt{(\varepsilon''_0 \cos\theta_{RC})^2 + (\varepsilon''_\perp \sin\theta_{RC})^2} \quad \text{Eq. (15)}$$

Figure 12D:
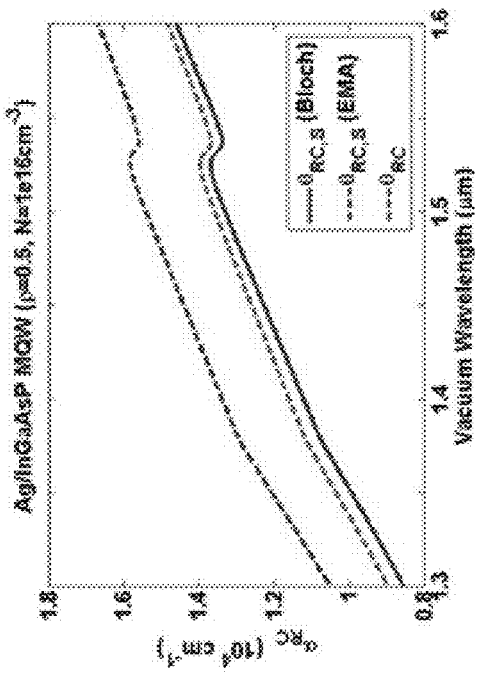
FIG. 12D shows an exemplary plot of dispersion of the imaginary effective permittivity elements.

The emission at 1350 nm experiences ~35% less attenuation than emission at 1550 nm, as shown in FIG. 12D. Thus the wavelength dependence of the principal direction of energy propagation is observed as a blue-shifting of peak emission in the LuHMS relative to the control MQW for the same pumping conditions. This blue-shifting occurs independently of the inhomogeneous broadening associated with filling of electronic states according to the Pauli Exclusion Principle.

Figure 9D:
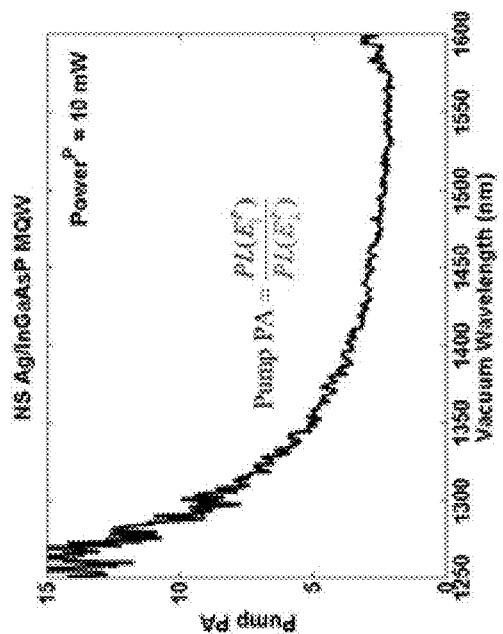
FIG. 9D shows an exemplary plot of DOLP for parallel-polarized pumping.

In addition to the strong dependence of total PL on pump polarization, the emission itself is highly polarized. The degree of linear polarization (DOLP) is defined as the difference between orthogonal polarization components of the PL relative to the total PL, i.e, $DOLP=|PL_\parallel-PL_\perp|/(PL_\parallel+PL_\perp)$, and is shown in FIG. 9D for parallel-polarized pumping. Regardless of pump polarization, the emission is predominantly polarized in the direction parallel to $K_B$. This occurs despite the fact that emission of bare InGaAsP MQW is predominantly polarized normal to $K_B$. The highly polarized emission of the LuHMS may be attributed to the fact that, in principle, hyperbolic media only support modes with an electric field component parallel to $K_B$. Consequently, only parallel-polarized emission from the MQW couples to the structure and reaches the far-field continuum by phase matching.

Coupling Between High-k States and Vacuum States without a Grating

In conventional multilayer structures with type-II hyperbolic dispersion, a grating is necessary to couple the high-k states supported by the HMM to vacuum for detection. By rotating the optical axis of the multilayer 90°, excitation and emission of high-k states becomes possible without the need of a grating. FIG. 13A shows a schematic diagram of the LuHMS, with wave-vector components parallel, $k_\parallel$, and normal, $k^\perp$, to the optical axis specified. Coupling of the pump beam at normal incidence (along the $k^\perp$ axis) into the LuHMS from vacuum, and coupling of normal emission from the LuHMS into vacuum, requires conservation of $k_\parallel$. FIG. 13B and FIG. 13C present the wave-vector diagram of the LuHMS at $\lambda_0=1064$ nm and $\lambda_0=1550$ nm, respectively, with losses omitted for clarity. Coupling occurs for HMM states with $k^\perp/k_0 > k_{bulk}$, such that $k_\parallel/k_0 < 1$. The black (1301) and green (1303) curves describe the states $(\pm k_\parallel, k^\perp)$ supported in vacuum and bulk MQW, respectively, while HMM states are described by blue (1305) and red (1307) curves, calculated by Bloch's Theorem and EMT, respectively. FIG. 13B shows that a pump beam, consisting of a finite angular bandwidth centered at normal incidence, will excite a range of high-$k^\perp$ states in the HMM. Considering an exemplary excitation half-angle of 24°, the angular bandwidth of the pump beam, in terms of wave-vector components $(\pm k_\parallel, k^\perp)$, is $(-0.41, 0.91)k_0 < \Phi < (0.41, 0.91)k_0$. Referring to FIG. 13B, conservation of $k_\parallel$ then shows that bulk and Bloch-HMM states in the ranges of $3.68 < k^\perp/k_0 < 3.70$ and $5.46 < k^\perp/k_0 < 5.48$, respectively, may be excited without use of a grating. Similarly, FIG. 13C shows that emission over the same angular bandwidth, allows states in the ranges $3.42 < k^\perp/k_0 < 3.45$ and $4.76 < k^\perp/k_0 < 4.77$ to out-couple from the bulk and Bloch-HMM, respectively, into vacuum without a grating.

Numerical simulations, as described above, indicate that the LuHMS functions as a polarization filter for the emission from the MQW, transmitting parallel-polarized emission to the far-field while reflecting normal-polarized emission towards the substrate.

Figure 14A:
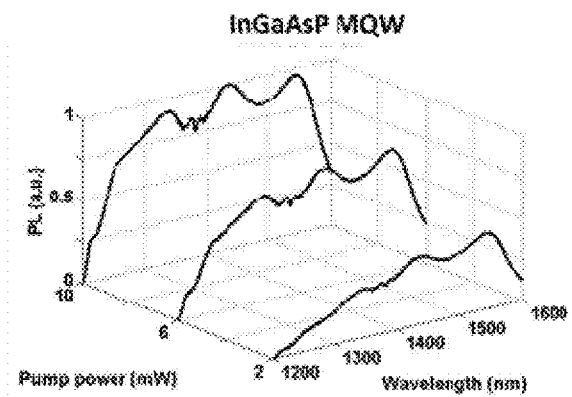
FIG. 14A shows an exemplary plot of PL spectra with pump power on linear scale.
Figure 14B:
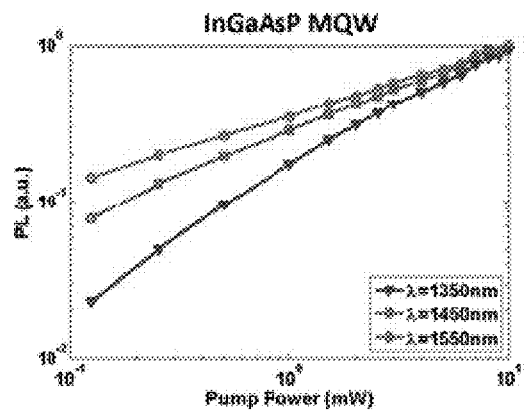
FIG. 14B shows an exemplary log-log plot of PL as a function of pump power for select wavelengths for InGaAsP MQW.
Figure 14C:
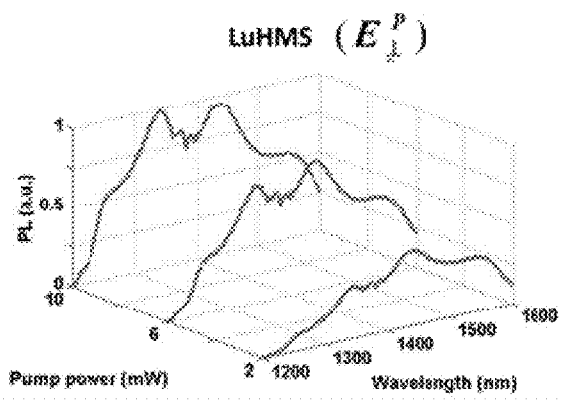
FIG. 14C shows an exemplary plot of PL spectra with pump power on linear scale for normal-polarized pumping.
Figure 14D:
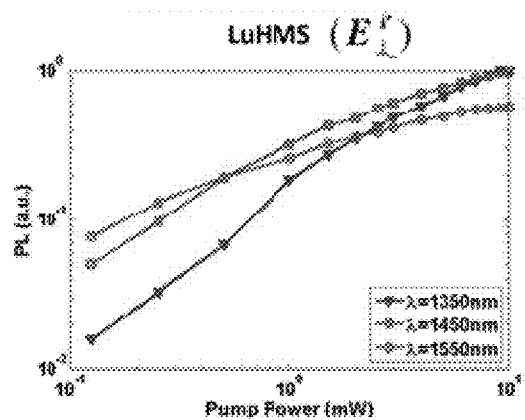
FIG. 14D shows an exemplary log-log plot of PL as a function of pump power for select wavelengths for normal-polarized pumping.
Figure 14E:
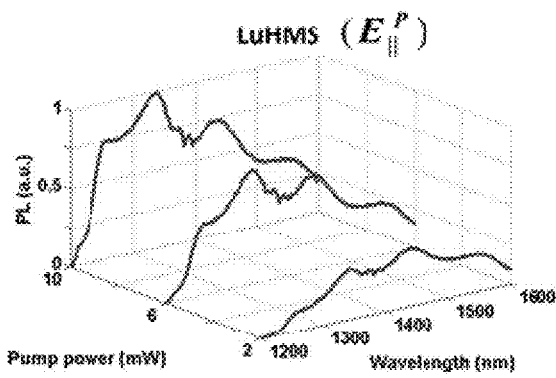
FIG. 14E shows an exemplary plot of PL spectra with pump power on linear scale for parallel-polarized pumping.
Figure 14F:
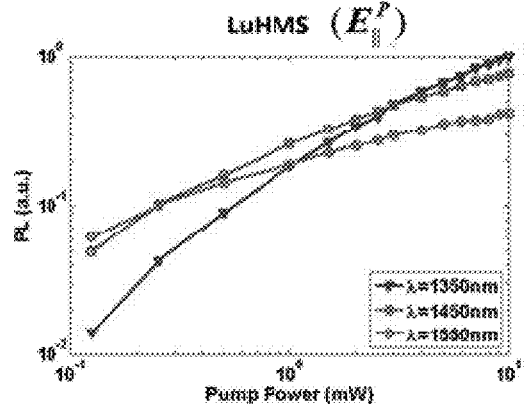
FIG. 14F shows an exemplary log-log plot of PL as a function of pump power for select wavelengths for parallel-polarized pumping.

FIGS. 14A-F demonstrate modified emission spectra in LuHMS. FIGS. 14A, 14C, and 14E show evolution of PL spectra with pump power on linear scale. FIGS. 14D-14F show log-log plots of PL as a function of pump power for select wavelengths. FIGS. 14A-14B shows control InGaAsP MQW. In FIGS. 14C-14D, LuHMS is excited by pump polarized normal to metacrystal Bloch vector, $K_B$ and, in FIGS. 14E-F, parallel to $K_B$. Significant blue shifting of peak PL occurs in the LuHMS relative to the control MQW, which is attributed to the wavelength dependence of the principal direction of energy propagation in the LuHMS. Additional blue shifting of peak PL occurs in LuHMS under parallel-polarized pumping due to greater pump absorption. The simultaneous dependence of PL on pump polarization and electronic and optical densities of states indicates an avenue for engineering tunable "meta-gain" materials.

Tolerance of Polarization Anisotropy to Small Changes in Geometric Parameters.

To further verify hyperbolic dispersion in the nanostructured Ag/InGaAsP MQW system, LuHMS has been subsequently designed and fabricated with wavelength-scale grating couplers, as shown in FIG. 15A. The grating couplers have been designed to increase absorption and emission of light polarized normal to $K_B$, and thereby reducing the pump PA and DOLP. Due to the unique multilayer design, parallel polarized emission may not require a grating. PL measurements show a significant reduction in PA for LuHMS with grating periods of $\Lambda_G=390$ nm and $\Lambda_G=520$ nm, as shown in FIG. 15B. Regardless of grating period and deviations from fabrication specifications, the PA is always reduced. Additionally, emission from the LuHMS with gratings is less polarized, as shown by a reduction in DOLP in FIG. 15C. Grating coupling therefore provides a control mechanism for pump PA and emission DOLP.

Figure 16A:
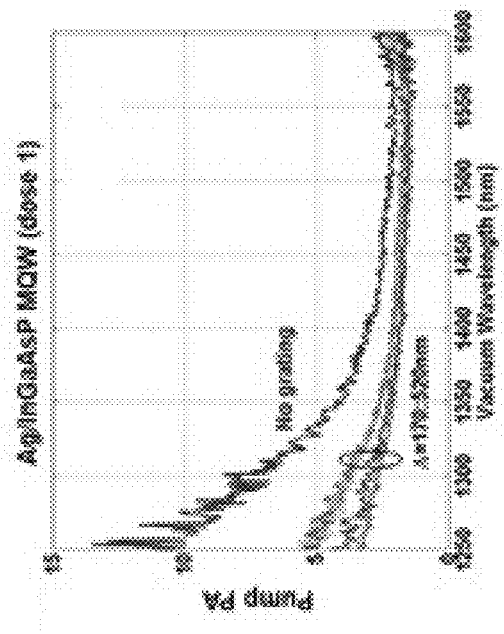
FIG. 16A shows an exemplary plot of an LuHMS fabricated with a first electron-beam dose.
Figure 16C:
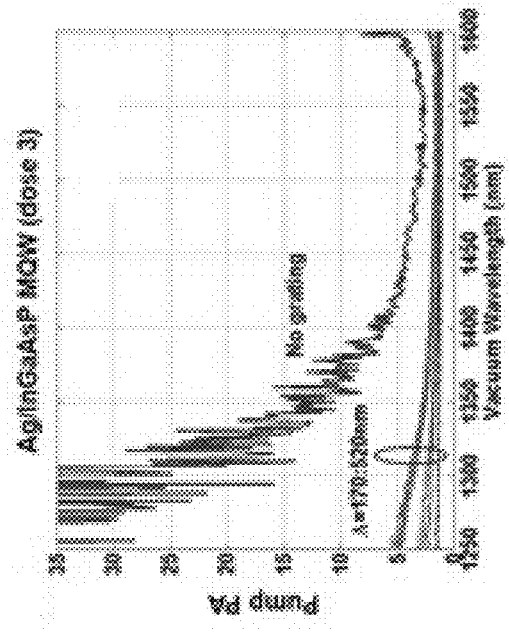
FIG. 16C shows an exemplary plot of yet another LuHMS fabricated with a third electron-beam dose.
Figure 16B:
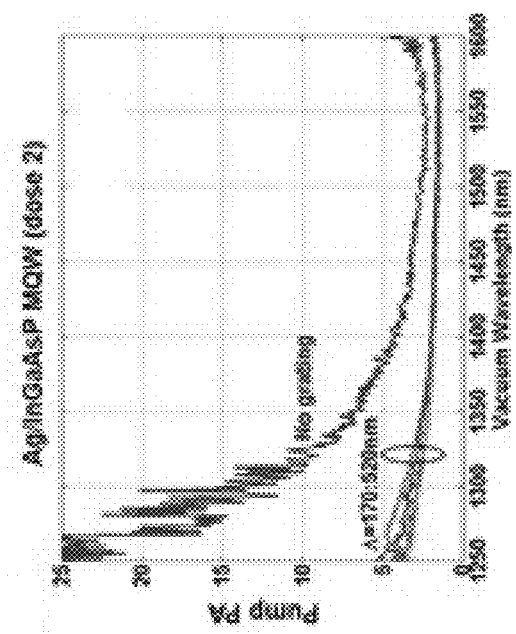
FIG. 16B shows an exemplary plot of another LuHMS fabricated with a second electron-beam dose.

To test the robustness of grating coupling to fabrication variability, pump polarization anisotropy (PA) on LuHMS fabricated with slightly varying period and grating size was measured. FIG. 16 shows an exemplary comparison of three LuHMS each fabricated with different electron-beam doses. Higher doses result in wider InGaAsP pillars and narrower trenches, resulting in a smaller Ag fraction for the multilayer structure. Regardless of grating period, the pump PA is dramatically reduced when the LuHMS contains a grating. Furthermore, slight changes to the geometric parameters are seen to have no qualitative effect on anisotropy. In FIG. 15, pump PA for the LuHMS without a grating is compared to pump PA in LuHMS with gratings of periods of 170 nm, 190 nm, 220 nm, 260 nm, 310 nm, 390 nm, and 520 nm. The trend of pump PA reduction via grating coupling remains consistent despite small changes to geometric parameters of the LuHMS.

Comparison of emission from the LuHMS to that from the control MQW sheds additional light on the interplay of electronic and optical density of states with the pumping condition. For all pump powers shown in FIGS. 14A and 14B, the transition at ~1550 nm, between the first conduction and heavy-hole subbands, dominates the spectrum of the control MQW. For identical pump powers, the peak emission from the LuHMS is blue-shifted relative to the control MQW. This occurs despite the fact that the blanket-sputtered Ag inevitably scatters the pump before it reaches the MQW. Under normal-polarized pumping, shown in FIGS. 14C and 14D, the transition at ~1450 nm, between the first conduction and light-hole subbands, dominates the spectrum of LuHMS at high power. Conversely, under parallel pumping, shown in FIGS. 14E and 14F, a transition at ~1350 nm between the second conduction and heavy-hole subbands dominates the high power spectrum.

Greater absorption may explain the blue shift of the parallel-pumped LuHMS relative to the normal-pumped LuHMS, however, it cannot explain blue-shifts of LuHMS emission relative to the control MQW. While the presence of Ag increases scattering, it also modifies the optical density of states, effectively filtering different spectral components of the emission. This may be understood through the wavelength dependence of the direction of energy propagation in the LuHMS. The resonance cone angle, which defines the principal direction of energy propagation relative to $K_B$, increases with wavelength. Consequently, shorter (longer) wavelengths of emission experience less (more) attenuation as they propagate along the LuHMS. Furthermore, the resonance cone angle depends upon pump intensity, indicating that peak emission wavelengths may be tuned by the directional properties of the LuHMS, in addition to electronic band-filling.

Intensity Enhancement of Photoluminescence

Figure 17A:
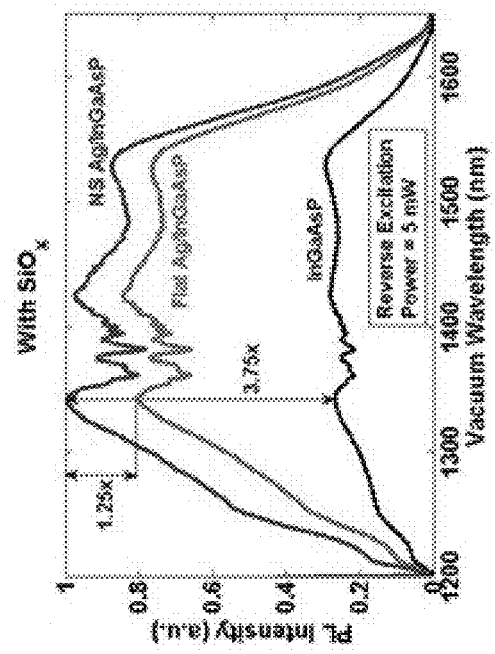
FIG. 17A shows exemplary PL spectra at an average pump power of 5 mW without SiOx.
Figure 17B:
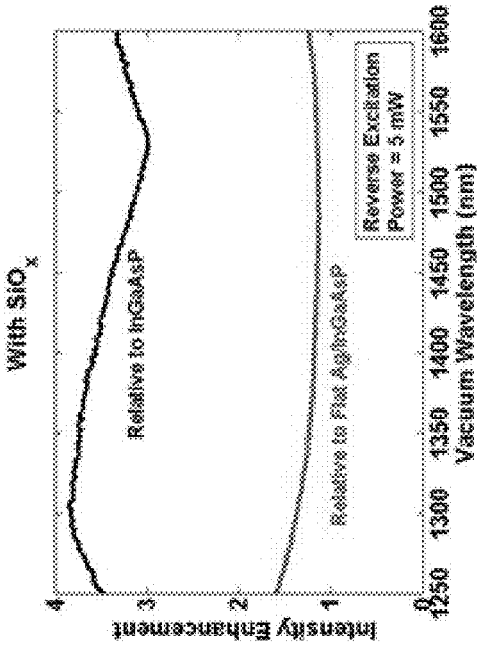
FIG. 17B shows exemplary PL spectra at an average pump power of 5 mW with SiOx.
Figure 17C:
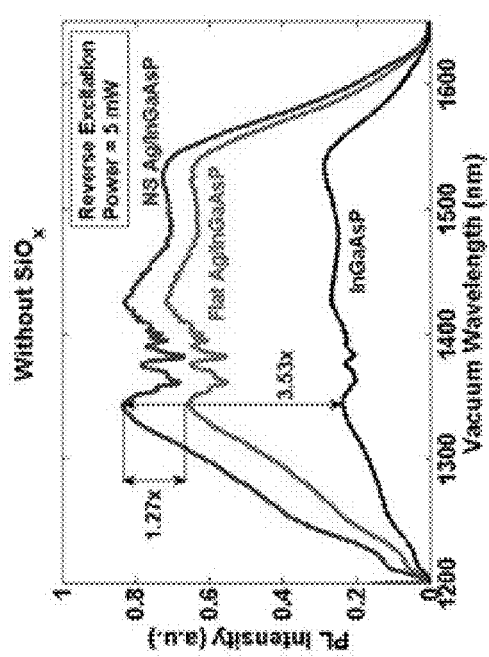
FIG. 17C shows exemplary PL intensity across an emission spectrum without SiOx.
Figure 17D:
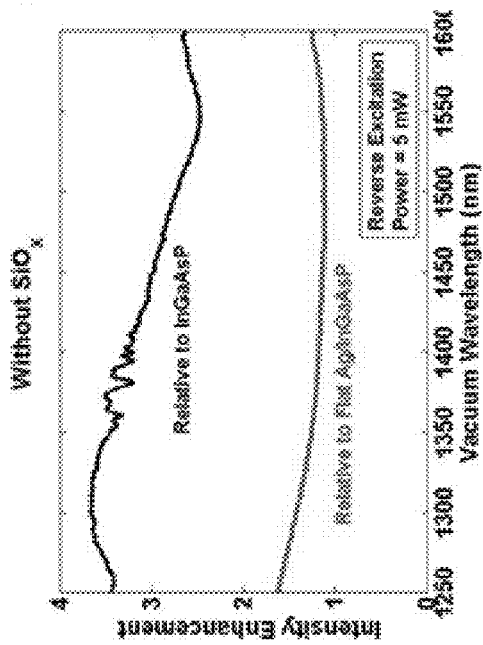
FIG. 17D shows exemplary PL intensity across an emission spectrum with SiOx.

To demonstrate that the additional high-k states provided by nanostructured Ag leads to enhanced PL, additional measurements were performed using a reverse excitation technique. In some embodiments, samples were fabricated with the exception that the InP capping layer was not removed. By omitting the HCl wet etch step from the process, the double-side polished samples remain smooth on both sides. Consequently, the MQW may be excited controllably from the substrate side, permitting a direct comparison between PL signals from the control MQW, flat Ag/InGaAsP interface, and nanostructured Ag/InGaAsP. Additionally, in some samples a 3 nm film of SiOx was sputtered prior to Ag sputtering, to form an insulation layer meant to reduce quenching of plasmonic states. FIGS. 17A and B show PL spectra at an average pump power of 5 mW for the three cases in the absence and presence of SiOx. Relative to the InGaAsP MQW and flat Ag/InGaAsP MQW interface, the nanostructured Ag/InGaAsP MQW system exhibits roughly 3.50× and 1.25× stronger PL intensities across the emission spectrum, quantified by the intensity enhancement of FIGS. 17C and D. Total PL signals of flat and nanostructured Ag/InGaAsP MQW is increased by ~1.25× in the presence of SiOx, while the PL from control InGaAsP changes negligibly, indicating that quenching of high-k states is indeed reduced.

Figure 18A:
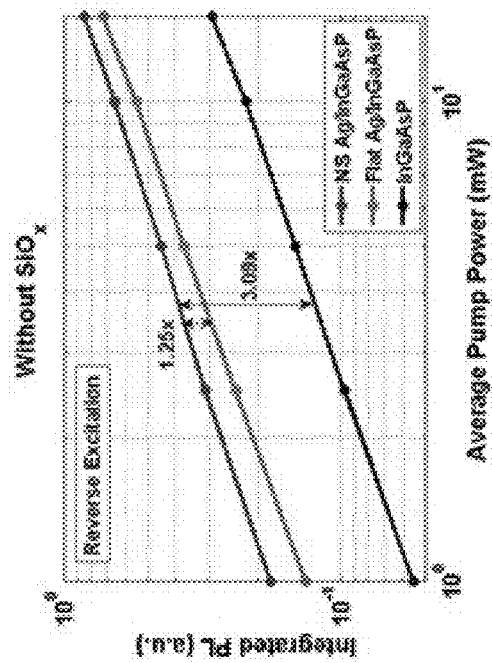
FIG. 18A shows an exemplary integrated PL as a function of average pump power for three cases without SiOx.
Figure 18B:
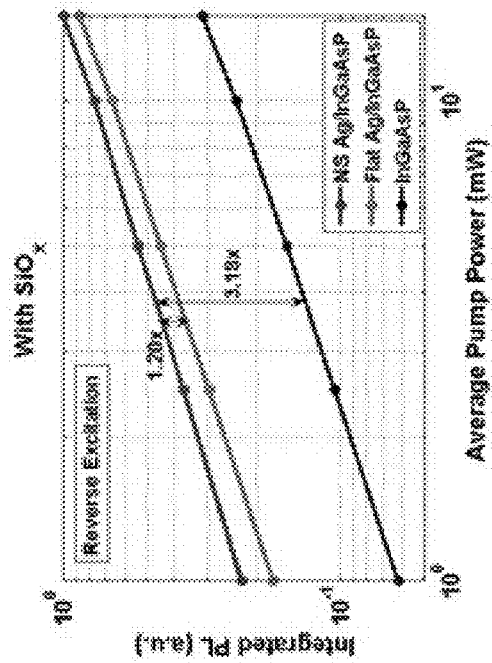
FIG. 18B shows an exemplary integrated PL as a function of average pump power for three cases with SiOx.
Figure 18C:
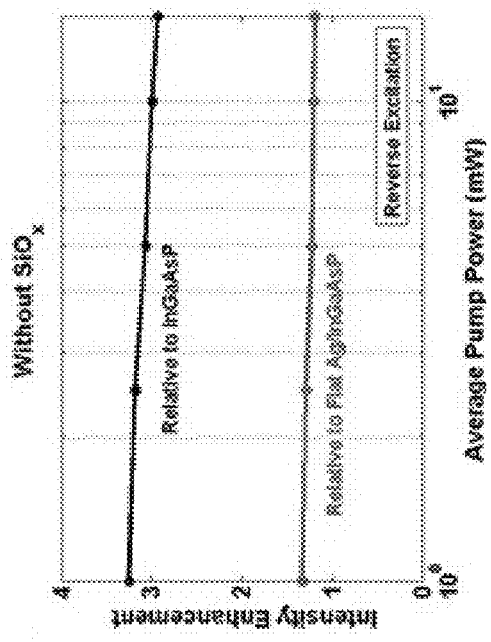
FIG. 18C shows exemplary intensity enhancement across an emission spectrum without SiOx.
Figure 18D:
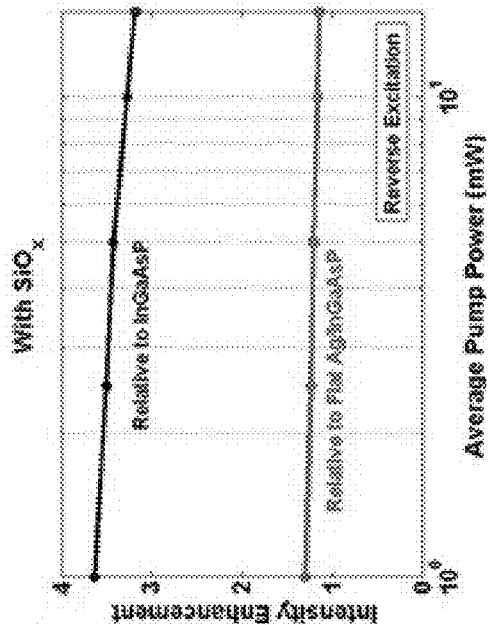
FIG. 18D shows exemplary intensity enhancement across an emission spectrum with SiOx.

FIGS. 18A and B show an integrated PL as a function of average pump power for the three cases. Relative to the InGaAsP MQW and flat Ag/InGaAsP MQW interface, the nanostructured Ag/InGaAsP MQW system exhibits ~3.0×-3.5× and 1.1×-1.3× stronger integrated PL across the range of pump powers studied, quantified by the intensity enhancement of FIGS. 18C and D. Further, it is observed that the integrated PL signals of flat and nanostructured Ag/InGaAsP MQW is increased by ~1.25× in the presence of SiOx, while the PL from control InGaAsP changes negligibly, indicating that quenching of high-k states is indeed reduced.

Beyond controlled extreme PA, the LuHMS also exhibits intensity enhancement of PL. Using a reverse excitation technique where the pump excites the active material from the substrate, it is observed that PL is enhanced by ~350% and ~25% in the LuHMS, relative to the control InGaAsP and flat Ag/InGaAsP interface, respectively. The observed intensity enhancement occurs across the entire emission spectrum and range of pump powers investigated.

To better understand the absorption and emission behavior of our fabricated samples, numerical finite-difference time-domain simulations have been performed at the pump and emission wavelengths, modeling the LuHMS as both an exact nanostructure and according to the EMA. The qualitative agreement between simulated results and experimental measurements confirms that the fabricated samples exhibit hyperbolic dispersion. Close quantitative agreement between results for the exact nanostructure and EMA additionally shows the utility of the EMA in designing the LuHMS. To dispel the counter argument that PA occurs equally on all scales of periodicity, pump absorption over a range of periods for which the EMA loses its validity has been simulated. The PA weakens significantly with increasing period, confirming that hyperbolic dispersion is necessary to observe extreme anisotropy of PL. Further, Bloch mode calculations reveal that only parallel-polarized modes are supported below a critical period length.

Principle and Realization of Meta-Gain Media.

The observed behavior of the LuHMS may be generalized by considering the main "ingredients" of the fabricated system in abstract terms. Essentially, the simultaneous co-optimization of pump properties, electronic density of states (DOS), and optical DOS leads to engineered meta-gain spectra with properties beyond those of the constituent gain media. This is shown schematically in FIG. 19A. Pump properties include, but are not limited to, polarization and power. Electronic DOS may be continuous (1901), step-like (1902), inverse square root like (1903), or delta-function like (1904), representative of bulk, quantum well, quantum wire, and quantum dot semiconductors, respectively. Optical DOS may be elliptical (1905), closed hyperbolic (1906), or open hyperbolic (1907), representative of conventional dielectric, and type I and type II hyperbolic metamaterials, respectively.

Figure 19A:
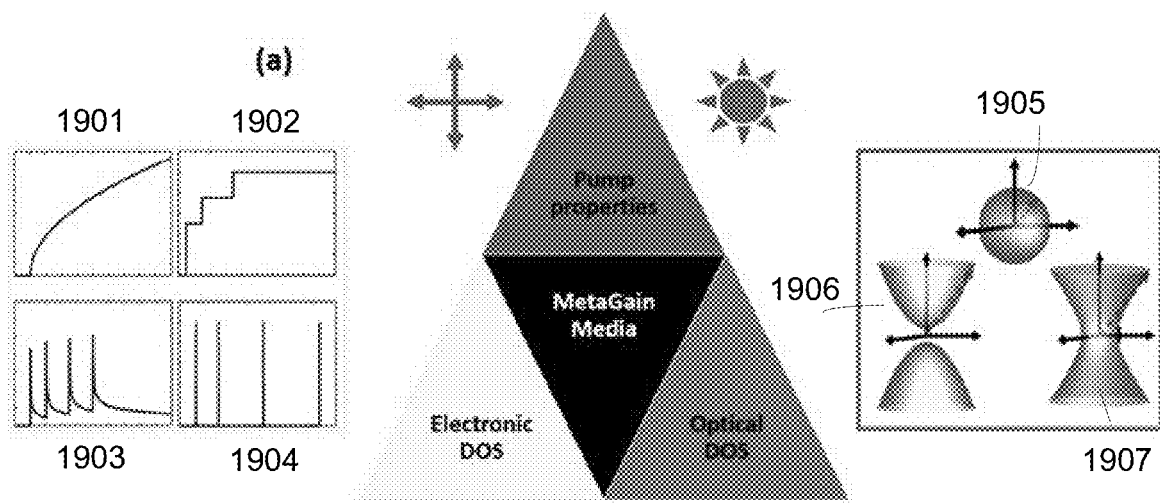
FIG. 19A shows a schematic diagram of engineered meta-gain spectra with properties beyond those of constituent gain media.
Figure 19B:
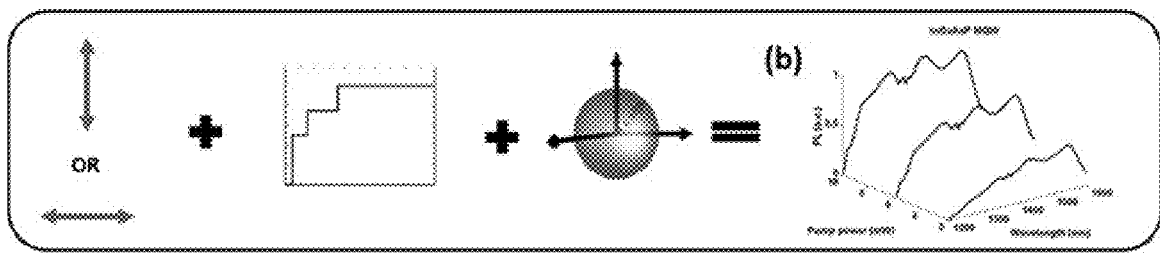
FIG. 19B shows an exemplary combination of pump polarization and optical density of states (DOS).
Figure 19C:
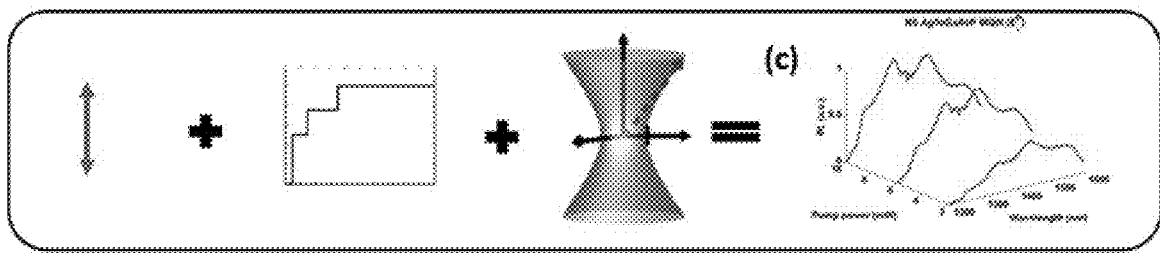
FIG. 19C shows another exemplary combination of pump polarization and optical DOS.
Figure 19D:
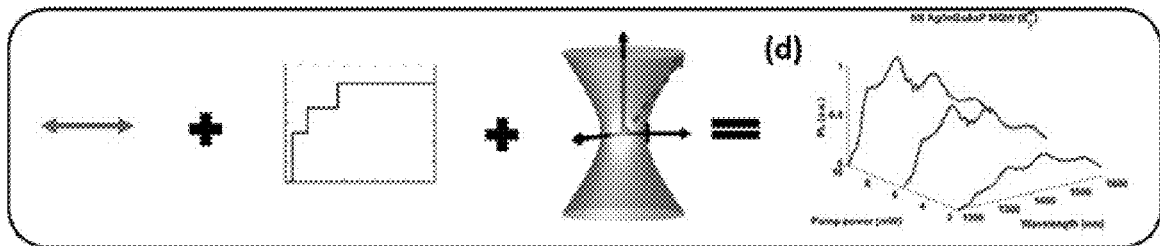
FIG. 19D shows yet another exemplary combination of pump polarization and optical DOS.

FIGS. 19B-D show that different combinations of pump polarization and optical DOS, with a fixed electronic DOS, lead to significantly different PL spectra and evolution with pump power. Thus the gain spectra seen by a weak probe signal is expected to be engineered with properties unobtainable with the MQW alone.

Fabrication Examples

In some embodiments, the heterostructures were grown offsite (OEpic©) and include 300 nm InGaAsP MQW layers epitaxially grown on an InP substrate. In some embodiments, the MQW includes nine 10 nm wells ($In_{0.564}Ga_{0.436}As_{0.933}P_{0.067}$) separated by 20 nm barriers ($In_{0.737}Ga_{0.263}As_{0.569}P_{0.431}$), with the exception that the final barrier is 30 nm. In some implementations, a 10 nm InP capping layer over this last barrier terminates the growth. Processing began with wet-etching of the InP capping layer with a 3 to 1 solution of hydrochloric acid to deionized water, followed by spin-coating of approximately 40 nm of hydrogen silsesquioxane (HSQ) EBL resist onto pristine InGaAsP cut into a 1 cm×1 cm sample area. The pattern was written using EBL with doses in the range of 850 to 950 μC cm$^{-2}$ at 30 kV and beam current of 3 nA. After exposure, the HSQ is developed and behaves as a glass-like mask for the etching of InGaAsP pillars. In some embodiments, the pillars are etched in a RIE machine using gas flow rates of 10 sccm CH$_4$, 40 sccm H$_2$, and 20 sccm Ar at a chamber pressure of 30 mTorr, temperature of 35° C., and RF power of 100 W. Subsequently, the HSQ was removed using a solution of 49% hydrofluoric acid. The Ag film was grown at room temperature under high vacuum (3×10$^{-9}$ Torr) by DC magnetron sputtering. In order to fill the trenches uniformly, the Ag target was positioned in a sputter gun directly below the etched InGaAsP and the sample holder was continuously rotated during the deposition. Once growth was initiated, the Ag film was deposited at a pressure of 1.3 mTorr with Ar gas flow of 50 sccm and DC power of 20 W. For some samples, an additional focused ion beam (FIB) step followed. Gratings of ~50-100 lines, with line width of 30 nm and variable pitch (period), were defined orthogonally to the metacrystal Bloch vector, $K_B$, with a Ga ion beam of voltage 30 kV and current 1.5 pA.

Example Characterization

A pulsed Nd:YAG pump laser, emitting 12 ns pulses at a repetition rate of 300 kHz and freespace wavelength of $\lambda_0$=1064 nm was used to optically excite the sample at normal incidence. With the aid of an infrared imaging system with a 50 μm×50 μm field-of-view, the pump was focused to a ~8 μm spot size, exciting the LuHMS using a 20× magnification microscope objective (MO) with 0.4 numerical aperture. With a maximum average power of 15 mW, the maximum average and peak intensities of the Gaussian beam used were 14.9 kW cm$^{-2}$ and 4.1 MW cm$^{-2}$, respectively. Before reaching the sample, the pump was passed through a polarizing beam splitter and polarization rotator, providing complete control of the direction of linear polarization. Broadband PL was collected with the same MO, passed through a linear polarizer, and directed to a monochromator with 1 mm slit width and 2 nm spectral resolution. An InGaAs photodiode, cooled thermoelectrically to −30° C., received the signal from the monochromator. The pump beam was chopped at a frequency of 1000 Hz and synchronized with the detection system using a digital lock-in amplifier. All characterization took place at room temperature.

Simulation Examples

Polarization anisotropy of the pump and emission were simulated using a two-dimensional finite-difference time-domain model. Periodic boundary conditions and perfectly matched layers were used in the direction parallel and normal to the metacrystal axis. For pump simulations, a quasi-monochromatic plane wave source was launched at normal incidence from air onto the structure. For emission simulations, a broadband plane wave source was launched at normal incidence from the substrate towards the structure. The simulated structures consisted of, both, InGaAsP pillars clad with Ag and the effective medium approximation. The complex dielectric functions of silver and InGaAsP were taken from a combination of experimental data and theoretical models. Mesh size for all simulations was 3 nm×3 nm.

FIG. 20 is a flowchart representation of a method 2000 for fabricating a light-emitting device. The method 2000 includes, at 2002, growing a multi-layer quantum structure on a substrate, wherein the multi-layer quantum structure includes alternative layers of a barrier material followed by a layer of a semiconductor material to produce multiple quantum wells, the multiple quantum wells separated by the alternative layers of the barrier material. The method 2000 includes, at 2004, using a mask to etch the multi-layer quantum structure to create a plurality of quantum heterostructures, wherein each of the plurality of quantum heterostructures is separated from another quantum heterostructure by a gap. The method 2000 also includes, at 2006, depositing a monocrystalline material to at least partially fill the gap between each of the plurality of quantum heterostructures.

It is thus evident that this patent document has demonstrated luminescent hyperbolic metasurfaces (LuHMS) using extreme polarization anisotropy of photoluminescence. The demonstrated dependence of LuHMS behavior on pump power and polarization are indicative of new opportunities for engineering "meta-gain" media, enabled by deeply subwavelength nanostructuring of luminescent materials. The inherent tunability enables enhanced functionality of hyperbolic dispersion, otherwise limited by excessive dissipation, and may prove useful for balancing losses of metallic components. Advantages of the demonstrated LuHMS include distribution of emitters throughout the entire HMM; coupling of high-k states to vacuum states without the need of a grating; polarization anisotropy at normal incidence; and potential for electronic addressability. The disclosed techniques can assist studies of temporal dynamics of emission, electronic transport, and field-enhanced nonlinear properties, with device applications in optical sensing, computing, and communications.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed are:

1. A semiconductor device, comprising:
a substrate; and
luminescent hyperbolic metasurfaces (LuHMS) including:
a plurality of quantum heterostructures, each heterostructure in the plurality of quantum heterostructures including multiple quantum wells that are separated by multiple quantum barriers, wherein each heterostructure in the plurality of quantum heterostructures is separated from another quantum heterostructure by a gap; and a monocrystalline material at least partially filling the gap between each heterostructure in the plurality of quantum heterostructures, wherein the luminescent hyperbolic metasurfaces behave as a metal in response to light waves of a first polarization state and as a semiconductor in response to light waves of a second polarization state orthogonal to the first polarization state.

2. The device of claim 1, wherein the substrate includes indium phosphide.

3. The device of claim 1, wherein the multiple quantum barriers include indium gallium arsenide phosphide.

4. The device of claim 1, wherein the multiple quantum wells include indium gallium arsenide phosphide.

5. The device of claim 1, wherein the monocrystalline material includes silver.

6. The device of claim 1, wherein each of the plurality of quantum heterostructures has a shape of a pillar.

7. The device of claim 1, wherein each of the plurality of quantum heterostructures has a height between 100 to 300 nm and a width between 40 to 80 nm.

8. The device of claim 1, wherein the gap has a width between 10 to 40 nm.

9. The device of claim 1, wherein the plurality of quantum heterostructures and the monocrystalline material form a periodic structure having a sub-wavelength pitch that is 15 to 20 times smaller than a vacuum emission wavelength of the multiple quantum wells.

10. The device of claim 1, further comprising a plurality of grating couplers to control a pump polarization anisotropy of the device.

11. A method of fabricating a luminescent hyperbolic metasurface, comprising:

growing a multi-layer quantum structure on a substrate, wherein the multi-layer quantum structure includes alternative layers of a barrier material followed by a layer of a semiconductor material to produce multiple quantum wells, the multiple quantum wells separated by the alternative layers of the barrier material;

using a mask to etch the multi-layer quantum structure to create a plurality of quantum heterostructures, wherein each heterostructure in the plurality of quantum heterostructures is separated from another quantum heterostructure by a gap; and depositing a monocrystalline material to at least partially fill the gap between each heterostructure in the plurality of quantum heterostructures, wherein the luminescent hyperbolic metasurface behaves as a metal in response to light waves of a first polarization state and as a semiconductor in response to light waves of a second polarization state orthogonal to the first polarization state.

12. The device of claim 1, wherein the plurality of quantum heterostructures and the monocrystalline material form a periodic structure having a period, and wherein a dimension of a quantum heterostructure from the plurality of quantum heterostructures in a direction of the period is smaller than a dimension of the quantum heterostructure in a direction orthogonal to the direction of the period.

13. The device of claim 1, wherein the plurality of quantum heterostructures and the monocrystalline material form a periodic structure having a period, and wherein the light waves of the first polarization state are light waves polarized orthogonal to a direction of the period, and wherein the light waves of the second polarization state are light waves polarized along the direction of the period.

14. The device of claim 1, wherein the light waves of the first polarization state are light waves polarized orthogonal to a direction of a Bloch vector of the luminescent hyperbolic metasurfaces, and wherein the light waves of the second polarization state are light waves polarized along the direction of the Bloch vector of the luminescent hyperbolic metasurfaces.

15. The method of claim 11, wherein the barrier material includes indium gallium arsenide phosphide.

16. The method of claim 11, further comprising:

developing the mask over the multi-layer quantum structure prior to the etching of the multi-layer quantum structure, wherein the mask includes hydrogen silsesquioxane; and removing the mask from the multi-layer quantum structure.

17. The method of claim 11, wherein the substrate includes indium phosphide.

18. The method of claim 11, wherein the multiple quantum wells include indium gallium arsenide phosphide.

19. The method of claim 11, wherein the monocrystalline material includes silver.

20. The method of claim 11, wherein each of the plurality of quantum heterostructures has a shape of a pillar.

21. The method of claim 11, wherein each of the plurality of quantum heterostructures has a height between 100 to 300 nm and a width between 40 to 80 nm.

22. The method of claim 11, wherein the gap has a width between 10 to 40 nm.

23. The method of claim 11, wherein the plurality of quantum heterostructures and the monocrystalline material form a periodic structure having a sub-wavelength pitch that is 15 to 20 times smaller than a vacuum emission wavelength of the multiple quantum wells.

24. The method of claim 11, wherein the plurality of quantum heterostructures and the monocrystalline material form a periodic structure having a period, and wherein a dimension of a quantum heterostructure from the plurality of quantum heterostructures in a direction of the period is smaller than a dimension of the quantum heterostructure in a direction orthogonal to the direction of the period.

25. The method of claim 11, wherein the plurality of quantum heterostructures and the monocrystalline material form a periodic structure having a period, and wherein the light waves of the first polarization state are light waves polarized orthogonal to a direction of the period, and wherein the light waves of the second polarization state are light waves polarized along the direction of the period.

26. The method of claim 11, wherein the light waves of the first polarization state are light waves polarized orthogonal to a direction of a Bloch vector of the luminescent hyperbolic metasurface, and wherein the light waves of the second polarization state are light waves polarized along the direction of the Bloch vector of the luminescent hyperbolic metasurface.

* * * * *